United States Patent [19]
Ando et al.

[11] Patent Number: 5,514,485
[45] Date of Patent: May 7, 1996

[54] AMORPHOUS OXIDE FILM AND ARTICLE HAVING SUCH FILM THEREON

[75] Inventors: Eiichi Ando; Koichi Suzuki, both of Yokohama; Junichi Ebisawa, Tokyo; Susumu Suzuki, Kawasaki, all of Japan

[73] Assignee: Asahi Glass Company Ltd., Tokyo, Japan

[21] Appl. No.: 358,473

[22] Filed: Dec. 19, 1994

Related U.S. Application Data

[62] Division of Ser. No. 821,448, Jan. 16, 1992, Pat. No. 5,399,435, which is a continuation of Ser. No. 318,330, Mar. 3, 1989, Pat. No. 5,110,637.

[30] Foreign Application Priority Data

| Mar. 3, 1988 | [JP] | Japan | 63-48765 |
| Mar. 31, 1988 | [JP] | Japan | 63-76202 |
| Jun. 14, 1988 | [JP] | Japan | 63-144827 |
| Oct. 21, 1988 | [JP] | Japan | 63-264163 |

[51] Int. Cl.⁶ .................................................. B32B 9/00
[52] U.S. Cl. ...................... 428/702; 428/446; 428/457; 428/697; 428/699; 428/701; 501/154
[58] Field of Search ........................ 428/702, 701, 428/446, 457, 689, 697, 699; 501/154, 53

[56] References Cited

U.S. PATENT DOCUMENTS 4,386,130 5/1983 Hayashi et al. ..................... 428/215

OTHER PUBLICATIONS

Patent Abstracts of Japan, JP 55–110D127, Aug. 25, 1980, AN–54–18238, Nakoto Azuma, "Preparation of Plastic Anti Reflection Films".
Patent Abstracts of Japan, JP 62–73202, AN–60–213845, Sep. 27, 1985, Yoshiharau O. I., "Production of Thin Optical Films".

Primary Examiner—Donald J. Loney
Attorney, Agent, or Firm—Oblon, Spivak, McClelland, Maier & Neustadt

[57] ABSTRACT

An amorphous oxide film composed essentially of an oxide containing at least one member selected from the group consisting of Zr, Ti, Hf, Sn, Ta and In and at least one member selected from the group consisting of B and Si.

8 Claims, 8 Drawing Sheets

AMORPHOUS OXIDE FILM AND ARTICLE HAVING SUCH FILM THEREON

This is a divisional of application Ser. No. 07/821,448, filed on Jan. 16, 1992, U.S. Pat. No. 5,399,435, which is a continuation of application Ser. No. 07/318,330, filed Mar. 3, 1989, now U.S. Pat. No. 5,110,637.

The present invention relates to an amorphous oxide film which is transparent and excellent in durability, and an article with high durability having such a film on its surface.

Heretofore, a mirror, a heat radiation reflecting glass, a low emissivity glass, an interference filter and a reflection preventive coating for camera lenses or eye glass lenses have been known as articles having an optical function imparted by forming a thin film on a transparent substrate such as a glass or plastic substrate.

In the case of ordinary mirrors, Ag is formed by electroless plating, or Al or Cr is formed by e.g. vacuum vapor deposition or sputtering. Among them, a Cr film is relatively tough, and as such, is used as a mirror having the coated surface exposed.

In the case of the heat radiation reflecting glass, titanium oxide or tin oxide is formed by spraying, chemical vapor deposition (CVD) or dipping. Recently, a heat radiation reflecting glass has been available in which a metal film, a nitride film or a tin-doped indium oxide (ITO) is formed by sputtering on a glass sheet. By the sputtering method, the film thickness can easily be controlled, and a plurality of films can continously be formed, whereby it is possible to obtain desired transmittance, reflectivity, color tone, etc. by proper combination of transparent oxide films. Therefore, the demand is increasing in the field of the building construction where ornamental design is important.

A low emissivity glass (low emission glass) to reflect a radiant heat from an air conditioner or from a wall in a room to the inside of the room, has a three-layered structure of ZnO/Ag/ZnO or a five-layered structure of ZnO/Ag/ZnO/Ag/ZnO, wherein silver is sandwitched between zinc oxide layers (Japanese Patent Application No. 280644/1986). It is used as a laminated glass or double-glazed glass. In recent years, there has been a remarkable increase in its use in cold regions in Europe.

A reflection preventive coating for lenses is formed by alternately laminating a film of high refractive index such as titanium oxide or zirconium oxide and a film of low refractive index such as silicon oxide or magnesium fluoride. It is common to employ vacuum vapor deposition. During the film-forming operation, the substrate is heated to improve the abrasion resistance.

A reflection preventive coating of e.g. a surface-coated mirror, a single plate heat radiation reflecting glass or a lens, is used in such a state that the coated film is exposed in air. Therefore, it must have good chemical stability and abrasion resistance. On the other hand, also in the case of the low emissivity glass, defective products are likely to result due to e.g. scratching during the transportation or handling prior to being formed into a laminated glass or a double-glazed glass. Under the circumstances, it is desired to have a protective layer which is stable and excellent in the abrasion resistance, or an optical thin film serving also as such a protective layer.

To improve the durability, it is common to provide a chemically stable transparent oxide film on the side to be exposed in air. As such an oxide film, titanium oxide, tin oxide, tantalum oxide, zirconium oxide and silicon oxide are known. A suitable oxide film has been used depending upon the required properties.

Titanium oxide and zirconium oxide are excellent in the chemical stability, but they tend to form a crystalline film, and the surface roughness tends to be substantial, whereby the friction in sliding contact is large, and the film is inferior in the abrasion resistance.

On the other hand, tin oxide and silicon oxide are not durable when immersed in an acid or an alkaline solution for a long period of time.

Among these materials, tantalum oxide has both the abrasion resistance and the chemical stability, but it is still inadequate in the abrasion resistance.

Further, titanium oxide, tin oxide, tantalum oxide and zirconium oxide have relatively high refractive indices. Whereas, silicon oxide has a relatively low refractive index. Therefore, there is a limitation in the freeness for optical design to provide various optical functions.

Heretofore, no thin film has been known that has high durability and a wide range of freeness for optical design.

It is an object of the present invention to solve the above problems.

The present invention provides an amorphous oxide film composed essentially of an oxide containing at least one member selected from the group consisting of Zr, Ti, Hf, Sn, Ta and In and at least one member selected from the group consisting of B and Si.

Further, the present invention provides a process for producing an amorphous oxide film composed essentially of an oxide containing at least one member selected from the group consisting of Zr, Ti, Hf, Sn, Ta and In and at least one member selected from the group consisting of B and Si, which comprises subjecting a non-oxide, oxide, or a mixture thereof containing at least one member selected from the group consisting of Zr, Ti, Hf, Sn, Ta and In and at least one member selected from the group consisting of B and Si to sputtering.

Still further, the present invention provides an atricle with high durability which comprises a substrate and one or more thin film layers formed thereon, wherein the outermost layer exposed to air is made of an amorphous oxide film composed essentially of an oxide containing at least one member selected from the group consisting of Zr, Ti, Hf, Sn, Ta and In and at least one member selected from the group consisting of B and Si.

Now, the present invention will be described in detail with reference to the preferred embodiments.

BRIEF DESCRIPTION OF THE DRAWINGS

FIG. 10 is a perspective view of a bar cord reader having a transparent sheet composed of one layer of the amorphous oxide film of the present invention at the read out portion of the bar cord reader.

Figure 1A:
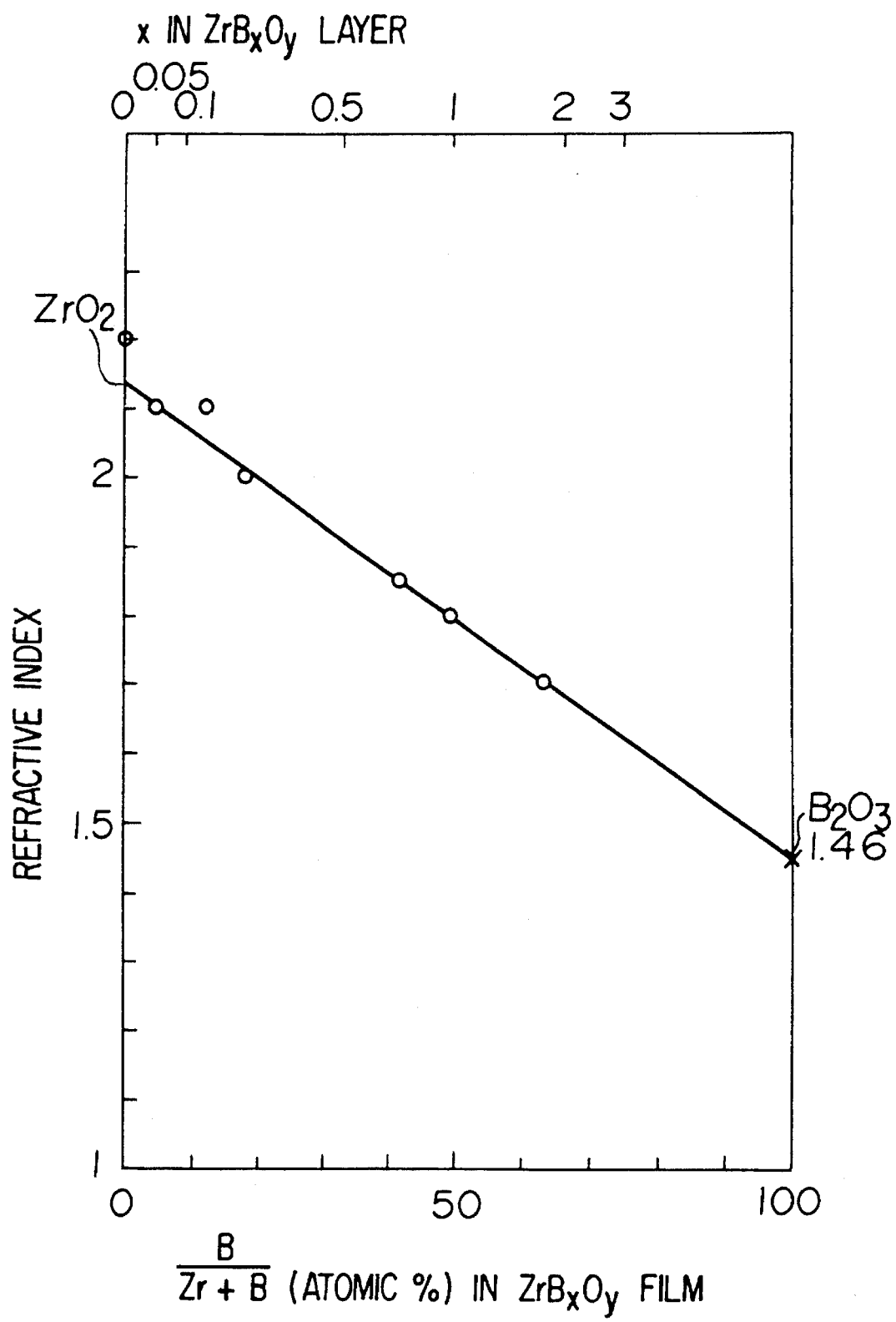
FIG. 1(a) is a graph showing the relation between the content of B in a $ZrB_xO_y$ film and the refractive index n of the film.

The present invention is based on discovery that an amorphous oxide containing at least one member selected from the group consisting of Zr, Ti, Hf, Sn, Ta and In and at least one member selected from the group consisting of B and Si, is a thin film which is excellent in the scratch resistance, the abrasion resistance and the chemical durability and which also has freeness for optical design.

The abrasion resistance was determined by a Taber abrasion test (abrasive ring: CS-10F, load: 500 g, rotational speed: 1,000 rpm). Symbol ○ means that the haze was not more than 4%, and x means that the haze exceeded 4%.

The acid resistance was determined by immersion in 0.1N $H_2SO_4$ for 240 hours. Symbol ○ means that the change in Tv (visible light transmittance) and Rv (visible light reflectivity) as between before and after the immersion was within 1%, Δ means that the change was from 1 to 4%, and x means that the film was dissolved and disintegrated.

The alkali resistance was determined by immersion in 0.1N NaOH for 240 hours. Symbol ○ means that the change in Tv and Rv as between before and after the immersion was within 1%, and x means that the film was dissolved.

The boiling test was conducted by immersing the test piece in water of 100° C. for two hours under 1 atm. Symbol ○ means that the change in Tv and Rv as between before and after the immersion was within 1%, and x means that the change exceeded 1%.

TABLE 1

| Sample Nos. | Target constituting substances | Target composition | Film forming method (atmosphere) | Film composition B(x) | Film composition Si(z) | Film composition O(y) | Acid resistance | Alkali resistance | Boiling test | Scratch resistance | Abrasion resistance | Refractive index | Crystallinity | Notes |
|---|---|---|---|---|---|---|---|---|---|---|---|---|---|---|
| Comparative Example | Zr | Zr 100 | DC sputtering (Ar + $O_2$) | — | — | — | ○ | ○ | ○ | X | X | 2.14 | Crystalline | $ZrO_2$ film |
| 1 | Zr-$ZrB_2$ | Zr90-B10 | | 0.045 | — | 2.07 | ○ | ○ | ○ | X | X | 2.1 | Crystalline | $ZrB_xO_y$ film |
| 2 | Zr-$ZrB_2$ | Zr70-B30 | | 0.14 | — | 2.21 | ○ | ○ | ○ | ○ | ○ | 2.05 | Amorphous | |
| 3 | Zr-$ZrB_2$ | Zr50-B50 | | 0.22 | — | 2.33 | ○ | ○ | ○ | ○ | ○ | 2.0 | Amorphous | |
| 4 | Zr-$ZrB_2$ | Zr40-B60 | | 0.72 | — | 3.08 | ○ | ○ | ○ | ○ | ○ | 1.85 | Amorphous | |
| 5 | $ZrB_2$ | Zr33-B67 | | 0.99 | — | 3.49 | Δ | ○ | ○ | ○ | ○ | 1.80 | Amorphous | |
| 6 | $ZrB_2$-B | Zr20-B80 | | 1.78 | — | 4.67 | X | X | X | ○ | ○ | 1.70 | Amorphous | |
| 7 | $ZrSi_2$ | Zr33-Si67 | | — | 1.47 | 4.95 | ○ | ○ | ○ | ○ | ○ | 1.735 | Amorphous | $ZrSi_zO_y$ film |
| 8 | $ZrB_2$-$ZrSi_2$ | Zr33-B33-Si33 | | 0.22 | 0.92 | 4.17 | ○ | ○ | ○ | ○ | ○ | 1.741 | Amorphous | $ZrB_xSi_zO_y$ film |
| 9 | $ZrB_2$-$ZrSi_2$-Si | Sr20-B20-Si60 | | 0.22 | 2.23 | 6.78 | ○ | ○ | ○ | ○ | ○ | 1.626 | Amorphous | |
| 10 | $ZrB_2$-$ZrSi_2$-Si | Zr5-B5-Si90 | DC sputtering | 0.22 | 9 | 20.33 | ○ | ○ | ○ | ○ | ○ | 1.51 | Amorphous | $ZrB_x Si_zO_y$ film |
| 11 | $TiSi_2$ | Ti33-Si67 | (Ar + $O_2$) | — | 3.2 | 8.4 | ○ | ○ | ○ | ○ | ○ | 1.658 | Amorphous | $TiSi_zO_y$ |
| 12 | $ZrB_2$-$ZrO_2$ | Zr33-B4-O63 | RF sputtering | 0.045 | — | 2.07 | ○ | ○ | ○ | X | X | 2.1 | Crystalline | $ZrB_xO_y$ film |
| 13 | $ZrB_2$-$ZrO_2$ | Zr33-B32-O35 | (Ar + $O_2$) | 0.22 | — | 2.33 | ○ | ○ | ○ | ○ | ○ | 2.0 | Amorphous | |
| 14 | $ZrB_2$-$ZrO_2$ | Zr33-B63-O4 | | 0.99 | — | 3.49 | Δ | ○ | ○ | ○ | ○ | 1.80 | Amorphous | |

Table 1 shows the properties of various amorphous oxide films of the present invention. Each film was prepared by direct current (DC) reactive sputtering or RF sputtering by using a target having the composition as identified in Table 1. The crystallinity was determined by a thin film X-ray diffraction analysis. The scratch resistance was determined by the abrasion test by means of an abrasive eraser. Symbol ○ means that no substantial scratch mark was observed, and x means that scratch marks easily formed.

With respect to a $ZrB_xO_y$ film, it is evident from Table 1 that a crystalline film tends to form when the content of B in the film is small, and an amorphous film tends to form when the content of B is large. It is also evident that the crystalline film is inferior in the scratch resistance and in the abrasion resistance, whereas the amorphous film is excellent in these properties. This is believed attributable to the fact that the amorphous film has a smooth surface. Thus, a film of $ZrB_xO_y$ wherein the atomic ratio x of B to Zr is 0.05≦x, preferably 1.0≦x, is excellent in the scratch resistance and in the abrasion resistance. A $B_2O_3$ film is hygroscopic and tends to be dissolved by absorption of moisture from air. Therefore, in the $ZrB_xO_y$ film, the atomic ratio x is preferably $x \leq 3$.

There is no particular restriction as to the atomic ratio of O (oxygen) to Zr in the $ZrB_xO_y$ film. However, if the atomic ratio is too high, the film structure tends to be rough. On the other hand, if the atomic ratio is too small, the film tends to be metallic, whereby the transmittance will be low, and the scratch resistance of the film tends to be low. Therefore, oxygen should preferably be in an amount sufficient to form a mixed system of $ZrO_2$ and $B_2O_3$. Namely, if the mixed oxide is represented by $ZrO_2+xBO_{1.5}$, it is preferred that $y=2+1.5x$ when B is contained in an amount of x in atomic ratio to Zr.

From Table 1, it is also evident that the refractive index of the film tends to decrease with an increase in the amount of B in the $ZrB_xO_y$ film. The relation between the film composition and the refractive index n is shown in FIG. 1(a). By an increase of B in the film, the refractive index n decreases from about 2.0 to about 1.5.

Thus, a $ZrB_xO_y$ film wherein x is $0.05 \leq x \leq 3$ and y is $2 < y \leq 6.5$ has excellent scratch resistance and abrasion resistance, and the refractive index can freely be controlled by adjusting the amount of B, and it is an amorphous oxide film suitable for the purpose of the present invention.

Further, as shown in Table 1, the acid resistance and the alkali resistance tend to deteriorate with an increase in the content of B in the film. When $x \geq 1$, the acid resistance becomes poor, and when $x > 1.5$, the alkali resistance becomes poor and the boiling test result shows a deterioration. Accordingly, in an application where the film is used as exposed in air, an amorphous oxide film of $ZrB_xO_y$ wherein x is $x \leq 1.5$, particularly, $x \leq 1.0$, is preferred. And a film of $ZrB_xO_y$ wherein x is $x > 1.5$, is useful in other applications as a low refractive index film.

As described in the foregoing, it is believed that by the addition of B to a $ZrO_2$ film, the film becomes amorphous, and the surface becomes smooth, whereby the abrasion resistance and the scratching resistance are improved. Further, it is possible to control the refractive index by adjusting the amount of B. Furthermore, as compared with the $ZrO_2$ film, the internal stress is small, which is advantageous for the adhesion to the substrate (glass, plastics, etc.) or to a primer coating layer on the substrate. This is particularly advantageous when a thick film is to be formed.

Figure 1B:
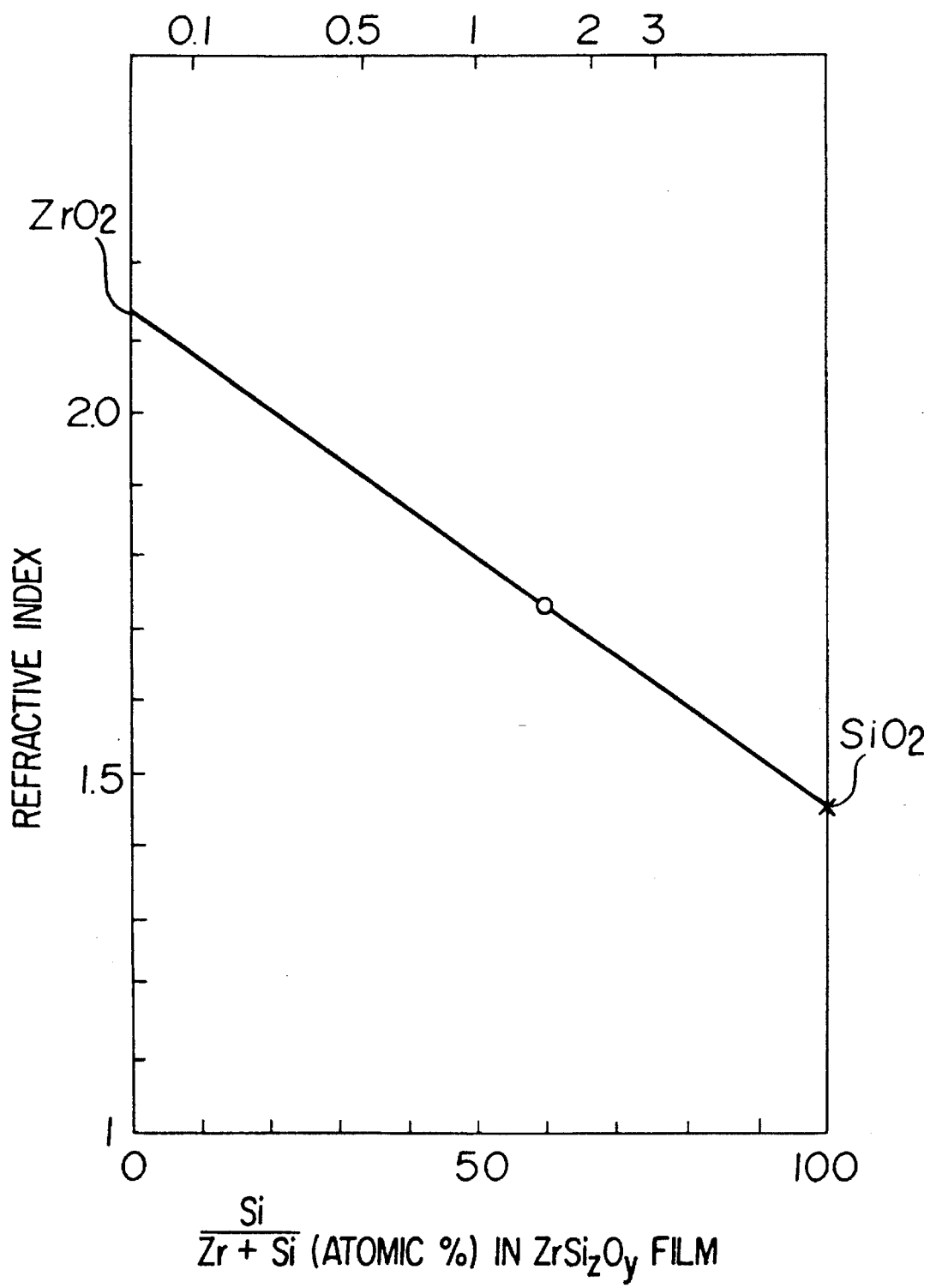
FIG. 1(b) is a graph showing the relation between the content of Si in a $ZrSi_zO_y$ film and the refractive index n of the film.

With respect to a $ZrSi_zO_y$ film, it is also possible to obtain an amorphous film having excellent scratch resistance and abrasion resistance. The refractive index varies depending upon the proportions of $ZrO_2$ (n=2.15) and $SiO_2$ (n=1.46) (see FIG. 1(b)). Table 1 shows a case where $ZrSi_{1.47}O_{4.95}$ was formed by DC sputtering by using a target composed of 33% of Zr and 67% of Si. More specifically, in a $ZrSi_zO_y$ film, the atomic ratio z of Si to Zr in the film is preferably $0.05 \leq z > 19$. If $z > 0.05$, the film will not be amorphous, and no adequate physical durability will be obtained. On the other hand, if $z \geq 19$, the alkali resistance tends to be poor. The atomic ratio y of O to Zr in the film of $ZrSi_zO_y$ is preferably $y=2+2z$ when Si is contained in an amount of z in atomic ratio to Zr, for the same reason as described with respect to the $ZrB_xO_y$ film.

Accordingly, in an application where the film is used as exposed in air, a $ZrSi_zO_y$ film wherein z is $0.05 \leq z < 19$ and y is $2.1 \leq y < 40$, is preferred. A $ZrSi_zO_y$ film wherein z is $19 \leq z$, is useful for other applications as a low refractive index film.

Figure 1C:
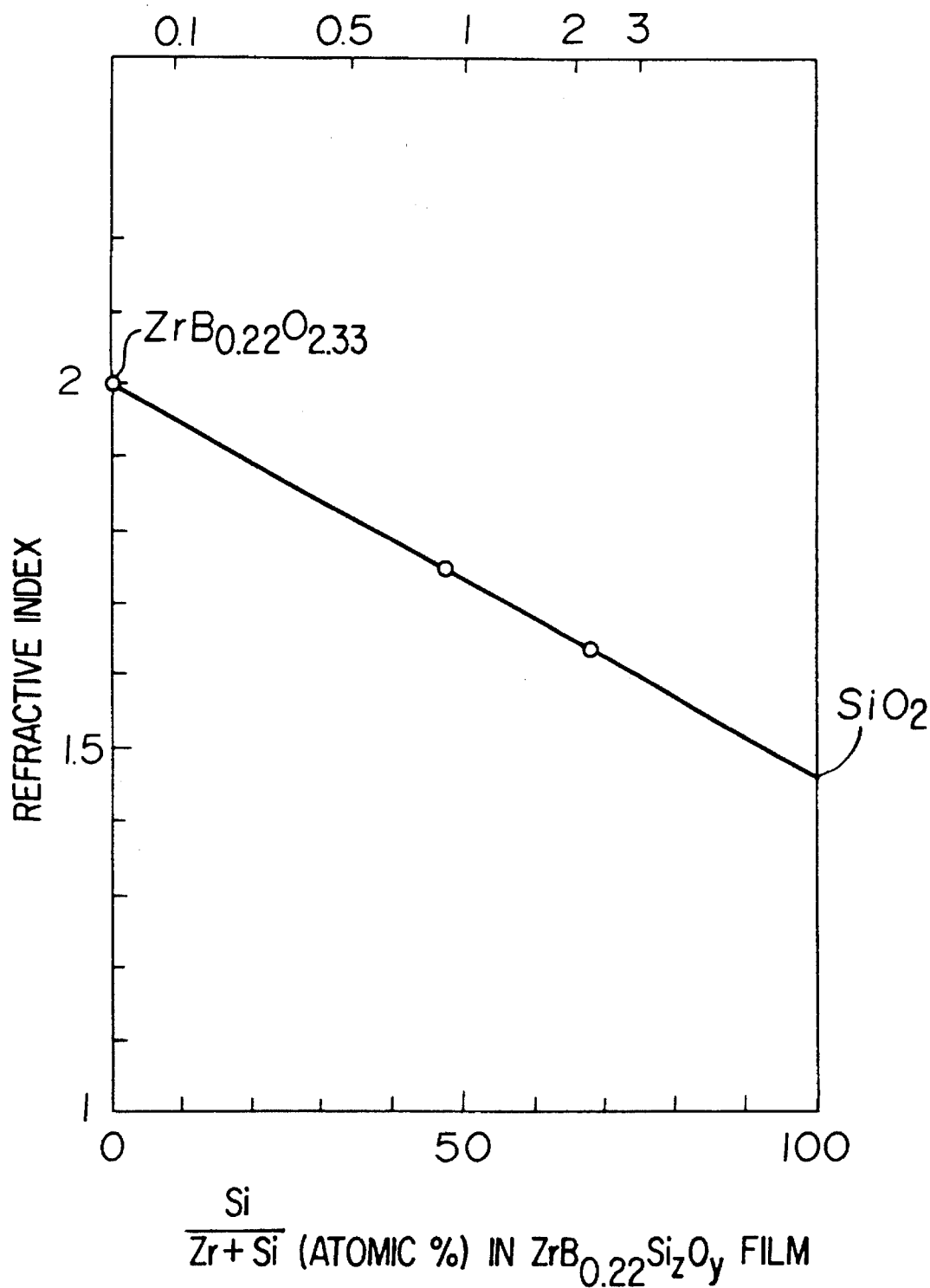
FIG. 1(c) is a graph showing the relation between the content of Si in a $ZrB_{0.22}Si_zO_y$ film and the refractive index n of the film.
Figure 1D:
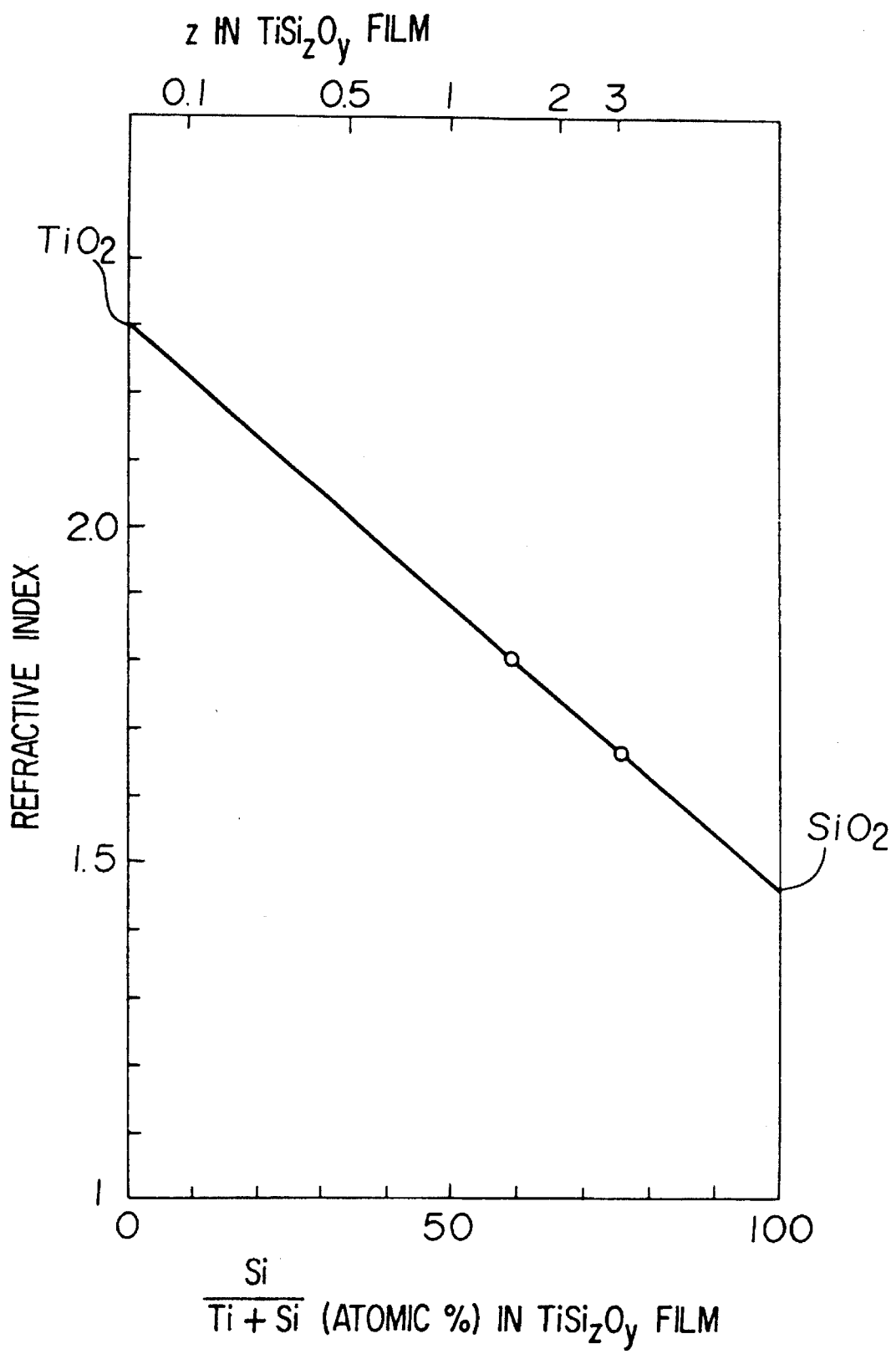
FIG. 1(d) is a graph showing the relation between the content of Si in a $TiSi_zO_y$ film and the refractive index n of the film.

A $ZrB_xSi_zO_y$ film is also suitable for the purpose of the present invention. With respect to the atomic ratio x of B, the atomic ratio z of Si and the atomic ratio y of O to Zr in such a film, $x+y \geq 0.05$ is preferred, since the film will thereby be amorphous, and a film having excellent scratch resistance and abrasion resistance will thereby be obtained. Further, if $x>0.25z+3$ when $x>3$, the acid resistance of the film tends to be inadequate, and if $y \geq 19$, the alkali resistance tends to be poor. This may be explained in such a manner that if the $ZrB_xSi_zO_y$ film is assumed to be a mixture of an oxide of Zr-B-O and an oxide of B-Si-O, the data on the $ZrB_xO_y$ film show that in the Zr-B-O system, the chemical stability tends to be inadequate when the atomic ratio x of B to Zr exceeds 3, and if this excessive B is contained in the B-Si-O system, the B-Si-O oxide tends to be chemically unstable when the atomic ratio x' of B to Si in the B-Si-O oxide exceeds 0.25. y is preferably at a level of $2+1.5x+2z$ when this film is assumed to be a mixed system of $ZrO_2+B_2O_3+SiO_2$, for the same reason as described in the case of $ZrB_xO_y$. Accordingly, y is preferably at a level of $2<y<40$. The larger the contents of B and Si, the lower the refractive index of the $ZrB_xSi_zO_y$ film. This is illustrated in FIG. 1(c) with respect to $ZrB_{0.22}Si_zO_y$ film.

An oxide containing a metal other than Zr i.e. at least one member selected from the group consisting of Ti, Hf, Sn, Ta and In, and at least one member selected from the group consisting of B and Si, will likewise be amorphous and provides adequate scratch resistance and abrasion resistance. As an example, a $TiSi_zO_y$ film is shown as sample 10 in Table 1.

The amorphous oxide film of the present invention may contain very small amounts of elements other than Zr, Ti, Hf, Sn, Ta, In, B, Si and O.

The amorphous oxide film of the present invention can be formed by a wet system such as spraying or by a physical vapor deposition method such as chemical vapor deposition, vacuum vapor deposition or sputtering. Particularly preferred is sputtering, since a film having superior adhesion as compared with other methods can thereby be obtained.

Figure 1E:
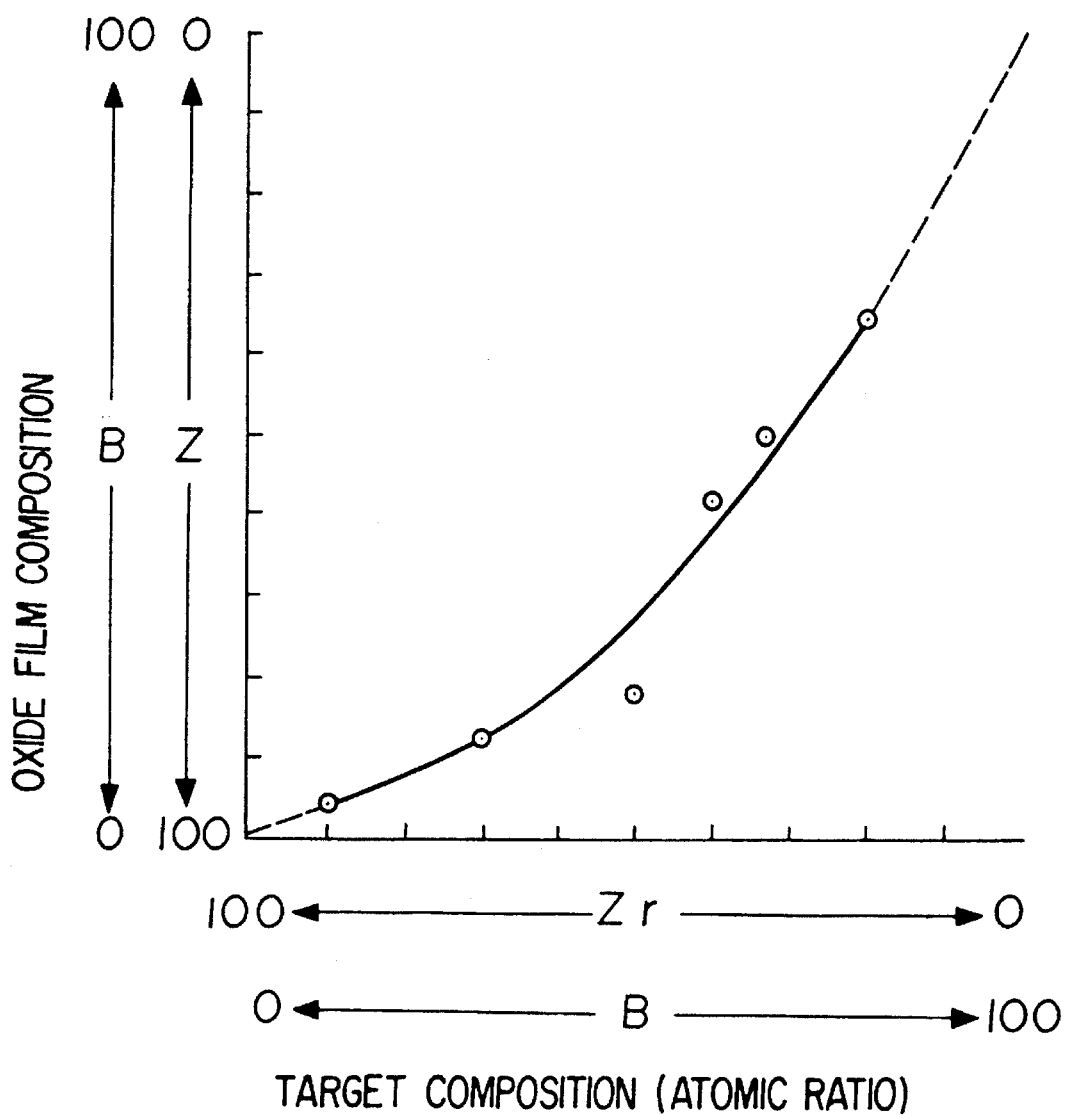
FIG. 1(e) is a graph showing the relation of the atomic ratio of Zr and B in a formed film relative to the atomic ratio of Zr and B in the target composition, when a $ZrB_xO_y$ film is formed by reactive sputtering.

As shown in Table 2, when a film of e.g. $ZrB_xO_y$, $ZrSi_zO_y$ or $ZrB_xSi_zO_y$ is to be formed by means of a target or an electrode of a non-oxide type comprising at least one member (M) selected from the group consisting of Zr, Ti, Hf, Sn, Ta and In and at least one member selected from the group consisting of B and Si, a uniform film can be formed by sputtering in an atmosphere of a mixture of argon and oxygen under a vacuum degree of from $1 \times 10^{-3}$ to $10 \times 10^{-3}$ Torr by using a target or an electrode of a non-oxide single system or a non-oxide mixed system such as a zirconium boride single system, a zirconium silicide single system, a zirconium boride-metal zirconium mixed system, a zirconium boride-zirconium silicide mixed system, a zirconium boride-metal silicon mixed system, a zirconium silicide-metal silicon mixed system, a zirconium boride-zirconium silicide-metal zirconium mixed system, a zirconium boride-zirconium silicide-metal silicon mixed system or a zirconium boride-boron mixed system. Such a non-oxide target has electrical conductivity, and the film forming can be conducted by direct current sputtering, whereby a uniform film can be formed at a high speed over a large surface area. When the reactive sputtering is conducted by means of a non-oxide target, the ratios of B and Si to Z in the target can not be maintained and tends to decrease in the film formed by using the target, as is apparent from Table 1. This tendency is remarkable when the content of B in the target is relatively small as shown in FIG. 1(e) with respect to the case of a $ZrB_xO_y$ film. As the content of B increases, the ratio of B in the target approaches the ratio of B in the film obtained therefrom. The same is true with respect to Si and Si+B in the case where a $ZrSi_zO_y$ film or a $ZrB_xSi_zO_y$ film is formed.

In view of the above tendency, in a case of forming a film of $ZrB_xO_y$ wherein x is $0.05 \leq x \leq 3$, and y is $2 < y < 6.5$, it is preferred to employ a target or an electrode comprising from 10 to 90 atomic % of Zr and from 10 to 90 atomic % of B. Likewise, the relation between the desired film and the corresponding composition of the target or the electrode, is shown in Table 2.

example, an oxide mixture comprising at least one member selected from the group consisting of zirconium oxide (inclusive of stabilized zirconia), boron oxide and silicon oxide and at least one member selected from the group consisting of metal zirconium, boron, metal silicon, zirconium boride and zirconium silicide, such as a zirconium oxide-zirconium boride target, a boron oxide-zirconium boride target, or a silicon oxide-zirconium boride target. The composition of such a target may be suitably adjusted by properly mixing the "oxide target" and the "non-oxide target" shown in Table 2 to obtain the desired oxidized

TABLE 2

| Desired film composition | Necessary composition of the target (electrode) (atomic %) | | |
| --- | --- | --- | --- |
| | Non-oxide target (electrode) | Oxide Target (tablet) | Oxide and non-oxide mixture target |
| $ZrB_xO_y$ $0.05 \leq x \leq 3$ $2 < y \leq 6.5$ | Zr 90–10 B 10–90 | Zr 31–4 B 3–35 O 66–61 | Zr 4–90 B 3–90 O 0–66 |
| $ZrB_xO_y$ $0.05 \leq x \leq 1.0$ $2 < y \leq 3.5$ | Zr 90–33 B 10–67 | Zr 31–12 B 3–25 O 66–63 | Zr 12–90 B 3–67 O 0–66 |
| $ZrSi_zO_y$ $0.5 \leq z \leq 19$ $2.1 \leq y < 40$ | Zr 90–5 Si 10–95 | Zr 30–1 Si 3–32 O about 67 | Zr 1–90 Si 3–95 O 0–67 |
| $ZrB_xSi_zO_y$ $0.05 \leq x + z$ $z < 19$ $2 < y < 40$ Provided when x >3, x = 0.25z + 3 | Zr 90–5 B + Si 10–95 Provided when 9Zr < B, B < 0.25Si + 9Zr | Zr 30–1 B + Si 3–32 O 66–67 Provided when 9Zr < B, B < 0.25Si + 9Zr | Zr 1–90 B + Si 3–95 Provided when 9Zr < B, B < 0.25Si + 9Zr |

Otherwise, the film-forming may be conducted by sputtering in a non-reducing atmosphere composed mainly of argon with a proper amount of oxygen under a vacuum degree of from $1 \times 10^{-3}$ to $10 \times 10^{-3}$ Torr by using an oxide type target containing at least one member selected from the group consisting of Zr, Ti, Hf, Sn, In and Ta and at least one member selected from the group consisting of B and Si. The oxide target useful for the formation of an oxide film containing Zr and at least one of B and Si, may be a mixed oxide target composed of at least two members selected from the group consisting of zirconium oxide (inclusive of stabilized or partially stabilized zirconia), boron oxide and silicon oxide, such as a zirconium oxide-boron oxide target, a zirconium oxide-silicon oxide target or a zirconium oxide-boron oxide-silicon oxide target. In this respect, preferred compositional ranges of targets are shown in Table 2.

In a case where the reactive sputtering is conducted using a non-oxide target, if the proportion of oxygen in the atmospheric gas is increased, the film-forming rate gradually decreases, although it is thereby possible to obtain a transparent film. Therefore, in order to secure a high-film-forming rate, it is necessary to control the oxygen concentration in the atmospheric gas to a certain level. Namely, it is necessary to conduct film-forming in an oxygen concentration within a transitional range from an absorptive film to a transparent film. However, it is very difficult to control the sputtering within such a transitional range. On the other hand, if the sputtering is conducted by using a completely oxide target, it is possible to obtain a transparent film, but the film-forming rate is relatively low. Therefore, by using a target made of partially oxidized substance, it is possible to form a transparent film constantly and at a high film-forming rate. For such a purpose, it is also possible to employ a target composed of a mixture of an oxide and a non-oxide, for degree of the target. The composition of such a target is preferably within the ranges shown in the column for "oxide and non-oxide mixture target" in Table 2. The sputtering atmosphere for the film-forming by means of such a target, may be determined depending upon the oxidized degree of the target so that the non-oxide component can be oxidized.

The amorphous oxide film of the present invention may be formed by using the above-mentioned oxide target or an oxide-non-oxide mixture target as a tablet for vacuum deposition, and heating and evaporating the tablet by means of an electron beam. As compared with a wet system such as spraying, in the vacuum deposition, precise control of the film thickness can easily be made. Therefore, vacuum deposition is preferred particularly in a case where a multi-layered film is prepared utilizing light interference.

The relation between the composition of the target and the composition of a film formed by means of the target, vary to some extent by the film-forming conditions and can not generally be defined. Those mentioned in Table 1 are specific examples of such compositions.

The above-mentioned electrode or target may be formed, for example, by the following method. Namely, a powder or a powder mixture comprising at least one member selected from the group consisting of metal zirconium, boron, metal silicon, zirconium boride, zirconium silicide, zirconium oxide (inclusive of zirconia stabilized or partially stabilized by an addition of from 3 to 8 mol % of e.g. $Y_2O_3$, CaO, MgO), boron oxide and silicon oxide, is subjected to high temperature-high pressure pressing or high pressure pressing, or by sintering a product of the high pressure pressing, to form a single system or mixed system electrode or target of the present invention. In this case, the particle size of the powder is preferably from 0.05 to 40 µm. Further, it has been confirmed that the properties remain to be the same even when such an electrode or target contains iron, aluminum, magnesium, calcium, yttrium, manganese and hydrogen in a total amount of not more than 2% by weight. Carbon may be contained in an amount of not more than 20% by weight, since it may be eliminated in the form of $CO_2$ gas during the film-forming operation. Furthermore, the electrode or target of the present invention shows similar effects even when it contains copper, vanadium, chromium, molybdenum, tungsten, cobalt, rhodium, or iridium in a small amount as an impurity.

The amorphous oxide film of the present invention has excellent scratch resistance and abrasion resistance and may, as such, be applied to various articles where high durability is required.

Namely, the present invention provides an article with high durability which comprises a substrate and one or more thin film layers formed thereon, wherein the outermost layer exposed to air is made of an amorphous oxide film composed essentially of an oxide containing at least one member selected from the group consisting of Zr, Ti, Hf, Sn, Ta and In and at least one member selected from the group consisting of B and Si.

Figure 2:
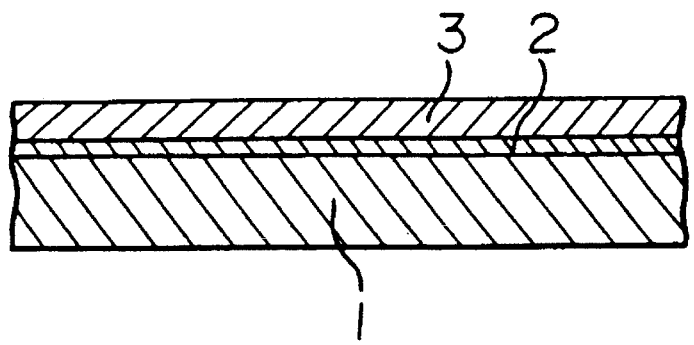
FIGS. 2 to 6, 9 and 10 are cross-sectional views of articles with high durability according to the present invention having the amorphous oxide films of the present invention on their surfaces.

FIG. 2 is a cross-sectional view of an embodiment of the article with high durability according to the present invention, wherein reference numeral 1 indicates a substrate made of e.g. a transparent or colored glass or plastic, numeral 2 indicates a first layer made of a metal, nitride, carbide, boride, oxide, silicide or a mixture thereof, and numeral 3 indicates a second layer of an amorphous oxide film constituting the outermost layer exposed to air, i.e. an amorphous oxide film composed essentially of an oxide containing at least one member selected from the group consisting of Zr, Ti, Hf, Ta, Sn and In and at least one member selected from the group consisting of B and Si.

Figure 3:
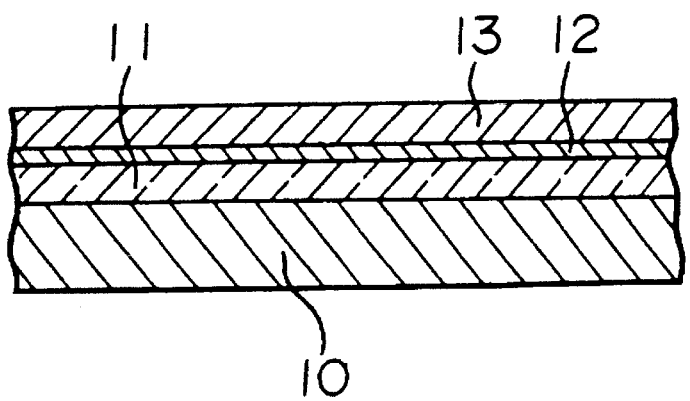

FIG. 3 is a cross-sectional view of another embodiment of the article with high durability according to the present invention, wherein reference numeral 10 indicates a substrate similar to the above-mentioned substrate 1, numeral 11 indicates a first layer of a transparent dielectric film, numeral 12 indicates a second layer of e.g. a nitride film similar to the first layer in FIG. 2, and numeral 13 indicates a third layer of an amorphous oxide film constituting the outermost layer exposed to air.

These embodiments have a multi-layered structure as described above. In some cases, one or more layers may be inserted between the substrate 1 and the first layer 2 or the first layer 2 and the second layer 3 of FIG. 2, or between the substrate 10 and the first layer 11, the first layer 11 and the second layer 12 or the second layer 12 and the third layer 13 of FIG. 3, in order to improve the adhesion, to control the optical properties or to impart other various functions. The most important feature of the article with high durability according to the present invention is that the outermost layer exposed to air is made of the amorphous oxide film to obtain an optical product having excellent abrasion resistance and chemical stability.

There is no particular restriction as to the amorphous oxide film for the second layer 3 in FIG. 1 or for the third layer 13 in FIG. 2, so long as it is amorphous as measured by the thin film X-ray diffraction analysis. Specifically, a mixed oxide film containing at least one member selected from the group consisting of Zr, Ti, Hf, Sn, Ta and In and at least one member selected from the group consisting of B and Si, is preferred in view of the scratch resistance and the abrasion resistance. Particularly preferred are a film of a $ZrB_xO_y$ wherein x is $0.05 \leq x \leq 1.0$, and y is $2 \leq y \leq 3.5$, a film of $ZrSi_zO_y$ wherein z is $0.05 \leq z < 19$, and y is $2.1 \leq y < 40$, and a film of $ZrB_xSi_zO_y$ wherein x, z and y are $0.05 \leq x+z$, $z<19$ and $2<y<40$, provided that when $x>3$, $x \leq 0.25z+3$. The refractive indices of such three films decrease as the contents of B and/or Si increase, as mentioned above. Therefore, the contents of B and/or Si may suitably be selected depending upon the desired refractive indices.

Such an amorphous oxide film containing Zr and B and/or Si is not limited to a three or four component system of zirconium, boron and/or Si and oxygen and may further contain other components to improve the durability, to adjust the optical properties or to improve the speed and the stability for film-forming. Further, the amorphous oxide film of the present invention may not necessarily be transparent, and may be an absorptive film in an oxygen-lacking state or a film partially containing nitrogen.

There is no particular restriction as to the thickness of the second layer 3 or the third layer 13 constituting the outermost layer. The thickness may be determined taking the transmittion color or the reflection color into consideration depending upon the particular purpose. However, if the layer is too thin, no adequate durability is obtainable. Therefore, it is preferably at least 50 Å, more preferably at least 100 Å, most preferably at least 200 Å.

There is no particular restriction also as to the method for forming the second layer 3 or the third layer 13. Vacuum vapor deposition, ion plating or sputtering may be employed. However, a reactive sputtering method excellent in the uniformity is preferred in a case where coating over a large area is required for e.g. automobiles or buildings, such as in the case of heat radiation shielding glass.

There is no particular restriction as to the film material for the first layer 2. The material may suitably be selected depending upon the required specification from metals, nitrides, carbides, borides, oxides, silicides or mixtures thereof.

In the case of the heat radiation shielding glass, the first layer 2 may be selected from the group consisting of metals such as Ti, Cr, Zr, Ta and Hf, carbides, oxides and mixtures thereof. However, it is preferably Ti, Cr, Zr, Ta, Hf, a nitride such as titanium nitride, zirconium nitride, hafnium nitride, chromium nitride or tantalum nitride or tin-doped indium oxide (ITO) in view of the excellent heat radiation shielding properties.

The thickness of the first layer 2 is desired to be at most 1,000 Å, preferably at most 500 Å, although it depends upon the desired transmittance. In the case of a nitride film, if the thickness exceeds 1,000 Å, the absorption by the nitride film tends to be excessive, and peeling is likely to occur due to the internal stress.

In the case of a nitride film, it is effective to adopt a three-layered structure as shown in FIG. 3, wherein an additional layer is formed between the substrate and the nitride layer in order to increase the adhesion with the glass surface. As such a first layer 11, an oxide such as titanium oxide, hafnium oxide, tin oxide, tantalum oxide or indium oxide, or a transparent dielectric film made of e.g. zinc sulfide, is preferred. From the viewpoint of the adhesion to the nitride film of the second layer 12 or the productivity by sputtering, the first layer is preferably a dielectric film containing the same elements as the nitride film of the second layer. However, the combination of the first layer 11/the second layer 12 is not limited to such a specific example but includes various combinations such as tantalum oxide/titanium oxide, zirconium oxide/titanium nitride and tin oxide/zirconium nitride. As the transparent dielectric film of the first layer 11, a film similar to the above-mentioned amorphous film may be used.

There is no particular restriction as to the thickness of such a dielectric film 11. However, since such a dielectric has a large refractive index, it is possible, by properly selecting the film thickness, to control the reflectance or the color tone by utilizing the interference effects. Particularly when it is used for a heat radiation shielding glass intended for high transmittance and low reflection in the visible light range by utilizing the interference effects, the thicknesses of the first layer 11 and the third layer 13 should preferably be adjusted to an optical film thickness within a range of from 1,000 to 1,800 Å. The refractive indices of the first layer 11 and the third layer 13 should preferably be selected within a range of from 2.0 to 2.5, but they may be outside this range so long as the optical film thicknesses are within the proper range. The thickness of the heat radiation shielding film of the second layer 12 is preferably at most 1,000 Å, most preferably within a range of from 50 to 500 Å, although it depends also on the desired transmittance. If the thickness exceeds 1,000 Å, the absorption of visible lights by the heat radiation shielding film tends to be excessive, whereby the transmittance tends to be low, or peeling is likely to occur due to the internal stress.

In a case where the outermost layer of the second layer 3 or the third layer 13 is an oxide film containing Zr and B and/or Si, it is effective to employ a nitride containing B and/or Si, particularly zirconium nitride, as the first layer 2 or the second layer 12 in order to improve the adhesion between the first layer 2 and the second layer 3 or between the second layer 12 and the third layer 13 and to reduce the internal stress in the first layer 2 or in the second layer 12.

In a case where tin-doped indium oxide (ITO) is used as the first layer 2, it is preferred to adopt ITO having a high carrier density and large mobility and having a thickness of at least 4,000 Å. In order to suppress the reflection color due to an interference, it is preferred to form ITO in a thickness of at least 7,000 Å. The second layer 3 is formed thereon, as a protective layer. Such an optical thin film having low resistance, high transmittance and good durability, is useful not only for a heat radiation shielding glass, but also for a window glass for shielding electromagnetic waves as a single plate, for electric heating and wind shielding of the front glass of an automobile, for antifogging of a rear glass, or for a transparent antenna. Further, by virtue of the chemical durability, it is useful as a protective coat for ITO (feeder electrode) of an electrochromic display element.

In the case of a low reflective glass, a film having a higher refractive index than the outermost layer 3 exposed to air, is formed as the first layer 2, or a three or more multi-layered structure is adopted. In the case of a three layered film, the reflectance can be reduced by adjusting the refractive index and the film thickness by forming an additional layer between the substrate 1 and the first layer 2 or between the first layer 2 and the second layer 3 in FIG. 1. There is no particular restriction as to the first layer 2 and the additional layer. It is possible to employ a low refractive index film and a high refractive index film having different contents of B and/or Si.

In the case of a low emissivity glass, it is effective to adopt a three layered structure of substrate/oxide film/Ag/amorphous oxide film (particularly an oxide film containing B and/or Zr) or a five layered structure of substrate/oxide film/Ag/oxide film/Ag/amorphous oxide film. There is no particular restriction as to such an oxide film. However, ZnO may be mentioned as an example. Otherwise, an oxide film containing Zr and B and/or Si, may be employed.

When the present invention is applied to a surface-coated mirror, chromium as a metal having good adhesion to glass may be formed as the first layer 2 on a substrate, and the amorphous oxide film of the present invention, particularly the amorphous oxide film containing B and/or Si and zirconium, may be formed thereon as the second layer 3.

The substrate 1 or 10 is usually made of glass or a plastic. When used as a mirror, the substrate is not limited to such materials and may be a non-transparent substrate made of e.g. a metal or ceramics so long as it has a flat and smooth surface.

As another application, it may be used as a protective film for a thermal head, i.e. not as an optical thin film.

In the present invention, the optical thin film may be formed only on one side of a substrate as shown in FIGS. 1 and 2, or may be formed on each side of the substrate.

The amorphous oxide film constituting the outermost layer exposed to air of the optical product of the present invention, i.e. the second layer 3 in FIG. 2 or the third layer 13 in FIG. 3, contains glass-constituting elements such as B and Si and thus is amorphous, whereby smoothness of the surface is high, and the frictional resistance is low. Thus, the amorphous oxide film has high durability and serves as a protective layer to improve the abrasion resistance or the chemical resistance of an optical article of the present invention. Further, by adjusting the refractive index and the film thickness, it is possible to control the optical functions such as the transmittance, the reflectance and the color tone.

Particularly when the outermost layer is an oxide film containing Zr and B and/or Si, B and Si contribute to the realization of a film having excellent durability satisfying both the abrasion resistance and the chemical stability, since the film is made amorphous by the addition of boron to zirconium oxide having chemical stability against an acid, an alkali, etc.

Further, B and Si contribute also to the control of the refractive index of the film. Namely, the refractive index can be lowered by increasing the proportions of B and Si.

In the present invention, layers other than the outermost layer primarily have optical functions and contribute to the transmittance or reflecting properties.

In an optical article having heat radiation shielding properties, a nitride film serves to provide the heat radiation shielding function. In a heat radiation shielding glass intended for high transmission and low reflection in the visible light range by means of interference effects, the first layer 2 in FIG. 2 and the second layer 12 in FIG. 3 serve to provide a heat radiation shielding function, and the first layer 11 and the third layer 13 have a function to prevent the reflection in the visible light range of the heat radiation shielding films 2 and 12, respectively.

Figure 4:
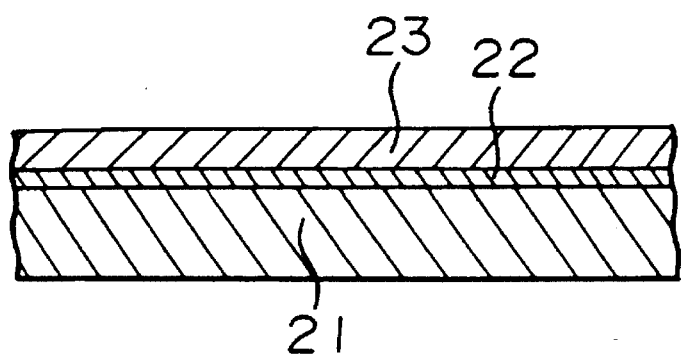

FIG. 4 is a cross-sectional view of another embodiment of the article with high durability according to the present invention. This embodiment is intended to provide a heat radiation shielding glass having high durability sufficient for use as a single sheet and having high transmittance for visible lights, particularly a transmittance of at least 70% so as to be useful as a window glass for automobiles, whereby the transmission color and the reflection color are both neutral. This embodiment provides a heat radiation shielding glass comprising at least two layers of a heat radiation shielding film and an oxide film formed sequentially on a transparent substrate, wherein the oxide film constitutes the outermost layer exposed to air and has a refractive index of at most 2.0.

In FIG. 4, reference numeral 21 indicates a transparent substrate, numeral 22 indicates a heat radiation shielding film, and numeral 23 indicates an oxide film having a refractive index of at most 2.0.

The most significant feature of the embodiment of FIG. 4 is to form an oxide film having a refractive index of at most 2.0 as the outermost layer exposed to air. If the refractive index of the oxide film of the outermost layer exposed to air exceeds 2.0, the reflectance for visible lights tends to be high. Consequently, the transmittance for visible lights will be low, whereby it will be difficult to obtain a transmittance for visible lights of a level of at least 70%. Thus, the refractive index of the oxide film 23 is preferably at most 2.0, more preferably at most 1.8, most preferably at most 1.7.

There is no particular restriction as to the film material for such an oxide film 23 so long as it has high durability and a refractive index of at most 2.0. However, among amorphous oxide films composed essentially of an oxide containing at least one member selected from the group consisting of Zr, Ti, Hf, Sn, Ta and In and at least one member selected from the group consisting of B and Si according to the present invention, the one wherein n is at most 2.0 is preferred, since it is excellent also in the scratch resistance and the abrasion resistance. In particular, a film of $ZrB_xO_y$ wherein x is $0.22 \leq x \leq 1.0$ and y is $2.33 \leq y \leq 3.5$, a film of $ZrSi_zO_y$ wherein z is $0.22 \leq z < 19$ and y is $2.44 < y < 40$ and a film of $ZrB_xSi_zO_y$ wherein x, z and y are $0.05 \leq x+z$, $z < 19$ and $2 < y < 40$ provided when $x > 3, x \leq 3+0.25Z$ and $n \leq 2.0$, are most suitable for applications where high durability is required, since they are excellent not only in the scratch resistance and the abrasion resistance but also in the chemical stability.

In the foregoing, an amorphous oxide film containing Zr and at least one of B or Si, has been described as a particularly preferred oxide film 23 for the outermost layer of the heat radiation shielding glass of FIG. 4. However, the oxide film 23 for the outermost layer is not limited to such a specific example and may further contain other components to improve the durability, to adjust the optical properties or to improve the speed and the stability for the film-forming. Further, the oxide film 23 of the heat radiation shielding glass of FIG. 4 may not necessarily be completely transparent and may be an absorptive film in an oxygen-lacking state or may contain a small amount of nitrogen or carbon.

There is no particular restriction as to the thickness of the oxide layer 23. However, if the layer is too thin, no adequate durability will be obtained. Therefore, the thickness is preferably at least 50 Å, more preferably at least 100 Å, most preferably at least 150 Å, although it depends upon the particular purpose. On the other hand, if the layer is too thick, there will be interference effects, and the reflection color will be strong, although it depends also on the refractive index. Therefore, the thickness is preferably at most 1,000 Å, more preferably at most 700 Å, most preferably at most 500 Å.

There is no particular restriction as to the film material for the heat radiation, shielding film 22. The film material may be selected from the group consisting of metals, carbides, oxides and mixtures thereof depending upon the particular purpose or the desired specification. Specifically, a film composed essentially of one member selected from the group consisting of titanium, chromium, zirconium, tantalum, hafnium, titanium nitride, chromium nitride, zirconium nitride, tantalum nitirde and hafnium nitride, is preferred, since it has excellent heat radiation shielding properties.

The thickness of such a heat shielding film 22 is preferably at most 1,000 Å, more preferably at most 800 Å depending upon the type of the substrate 21 and the refractive index and the thickness of the oxide layer 23. If the film 22 is too thick, the transmittance for visible lights decreases. Particularly, in the case of a nitride film, if the thickness exceeds 800 Å, the internal stress tends to be large, and peeling of the film is likely to occur. On the other hand, if the film 22 is too thin, no adequate heat radiation shielding properties will be obtained. Therefore, the thickness is preferably at least 20 Å, more preferably from 20 to 100 Å, although it depends also on the thicknesses and the types of the film material and the substrate glass.

Further, there is no particular restriction as to the method for forming the oxide layer 23 and the heat radiation shielding film 22. Vacuum vapor deposition, ion plating or sputtering may be employed. However, a reactive sputtering method excellent in the uniformity, is preferred in a case where coating over a large area is required.

The transparent substrate 21 is usually made of glass or a plastic.

In the embodiment of FIG. 4, the color tone being neutral is meant for the following characteristics. Namely, as represented by the CIE color index, the change widths of the x-coordinate and the y-coordinate as between before and after the formation of a film such as the heat radiation shielding film or the oxide film on the substrate surface, are represented by $\Delta x$ and $\Delta y$. $\sqrt{(\Delta x)^2+(\Delta y)^2}$ represents a color change due to the formation of the coating film, and the neutral color means that the value of this color change is at most 0.008 and 0.032, more preferably at most 0.007 and at most 0.028, with respect to the transmission color and the reflection color, respectively. However, the reflection color may be different as between the surface on which a coating film is formed and the surface on which no such film is fomred. In such a case, the neutral color means the larger value.

When the heat radiation shielding film 22 is a nitride film, an oxide film may be formed between the glass substrate and the nitride film in order to reduce the internal stress of the nitride film and thereby to increase the adhesion with the glass substrate. As another method of increasing the adhesion to the glass substrate, it is effective to employ a method wherein a primer layer is firstly formed on the glass substrate, then high energy ions are injected thereto, and thereafter, the heat radiation shielding film is formed thereon. For example, a titanium layer is formed as the primer layer, then high energy nitrogen ions are injected, and thereafter a titanium nitride film is formed, thereby a titanium nitride film having strong adhesion is obtainable as the heat radiation shielding film 22.

In the heat radiation shielding glass of FIG. 4, the oxide film 23 as the outermost layer exposed to air, exhibits an optical function by virtue of the refractive index and the film thickness. Namely, the oxide layer 23 serves to reduce the reflectance of the heat radiation shielding glass and contributes to an improvement of the transmittance for visible lights. At the same time, it has a function to reduce the stimulating purity of the reflection color and to neutralize the entire color tone. Further, the oxide film 23 serves as a protective film to improve the abrasion resistance and the chemical stability of the heat radiation shielding glass.

The heat radiation shielding film 22 serves to absorb solar energy and at the same time serves to control the transmittance for visible lights.

The heat radiation shielding glass of FIG. 4 has a multilayered structure of at least two layers wherein a heat radiation shielding film and an oxide film having a refractive index of at most 2.0 are laminated on a transparent substrate. Thus, it has a natural color tone and has high transmittance for visible lights and high durability. Accordingly, it can be used adequately as a single plate heat radiation shielding glass in an application where it is used in a severe environment, such as an application to building construction or an application to automobiles.

When an oxide film containing Zr and at least one of B and Si, is formed as the oxide film 23, a heat radiation shielding glass having excellent abrasion resistance and chemical resistance, is obtainable.

By increasing the proportion of B or Si, or the total amount thereof, it is possible to bring the refractive index of the oxide film to a level of at most 1.7, whereby it is possible to obtain a heat radiation shielding glass having a low reflectance for visible lights, high transparency and a neutral color tone.

Further, when such an oxide film containing Zr and at least one of B and Si, is used as the outermost layer 23 exposed to air, film-forming can be conducted by direct current (DC) sputtering. This is most suitable for an application to automobiles or building construction where a film covering a large area is required.

Figure 5:
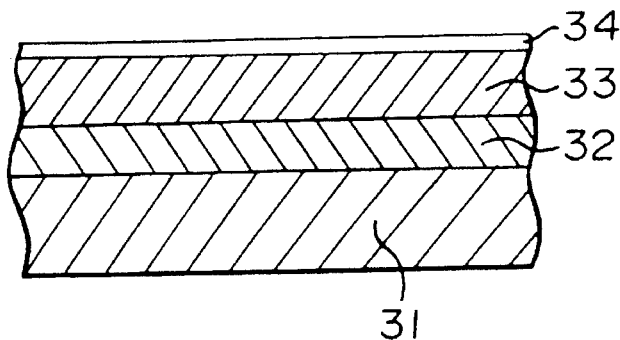

FIG. 5 is a cross-sectional view of a still another embodiment of the article with high durability according to the present invention. This embodiment is an improvement in the durability over the heat radiation shielding glass shown in FIG. 4. Namely, this is a heat radiation shielding glass wherein at least three layers of a heat radiation shielding film 32, a low refractive index oxide film 33 having a refractive index of at most 2.0 and a protective film 34, are formed on a transparent substrate 31 in this order from the substrate side.

The transparent substrate 31 and the heat radiation shielding film 32 are similar to the transparent substrate 21 and the heat radiation shielding film 22 in FIG. 4. The low refractive index oxide film 33 may be any oxide film so long as the refractive index is at most 2.0. In the case of FIG. 5, the low refractive index oxide layer 33 will not be the outermost layer and therefore is not required to be particularly excellent in the chemical stability. It is of course possible to employ the amorphous oxide film of the present invention composed essentially of an oxide containing at least one member selected from the group consisting of Zr, Ti, Hf, Ta, Sn and In and at least one member selected from the group consisting of B and Si. The low refractive index oxide film 33 serves to reduce the reflectance and to reduce the color due to interference of the reflection. It is preferred to form a thin metal layer prior to the formation of such an oxide film 33 in order to protect the heat radiation shielding layer 32 from oxidation, since it is thereby possible to readily control the transmittance, the reflectance and the color tone.

As a protective film 34 constituting the third layer which has not only physical durability but also chemical stability, a film of $ZrB_xO_y$ wherein x is $0.05 \leq x \leq 1.0$ and y is $2 < y \leq 3.5$, a film of $ZrSi_zO_y$ wherein z is $0.05 \leq z < 19$ and y is $2.1 \leq y < 40$ and a film of $ZrB_xSi_zO_y$ wherein x, z and y are $0.05 \leq x+z$, $z < 19$ and $2 < y < 40$ provided when $x > 3$, $x \leq 3 + 0.25Z$, are preferred, since they are excellent not only in the scratch resistance and the abrasion resistance but also in the chemical stability.

There is no particular restriction as to the thickness of the protective layer. However, if it is too thin, a continous film tends to be hardly obtainable. The thickness is preferably at least 30 Å, more preferably at least 50 521 , although it depends upon the film-forming method. On the other hand, if the protective layer is too thick, the color due to interference becomes remarkable. When a neutral outer appearance is required, the thickness is preferably at most 500 Å, more preferably at most 200 Å.

The heat radiation shielding film 32 may be the same as the above described heat radiation shielding film 22 of FIG. 4 and is preferably a film composed essentially of one member selected from the group consisting of one or more metals selected from the group consisting of Ti, Cr, Zr, Ta and Hf, nitrides of these metals, oxynitrides of these metals and absorptive oxides thereof, in view of the high heat radiation absorptive or reflective properties. Particularly preferred is titanium nitride or chromium oxynitride. The film thickness may be substantially the same as the heat radiation shielding film 23 of FIG. 4.

The heat shielding glass shown in FIG. 5 has the foregoing structure, whereby it has high durability (not only the physical durability but also excellent chemical stability) sufficient for use as a single sheet and a high transmittance for visible lights at a level of at least 70% so that it is useful as a window glass. It is available as a heat radiation shielding glass which is neutral with respect to both the transmission color and the reflection color.

When a chromium oxynitride film is used as the heat radiation shielding film, the resistance is high (at least 1 MΩ/□) as compared with a titanium nitride film, which is advantageous in that when used as a rear glass for an automobile, it does not reduce the function of a printed antenna.

Figure 6:
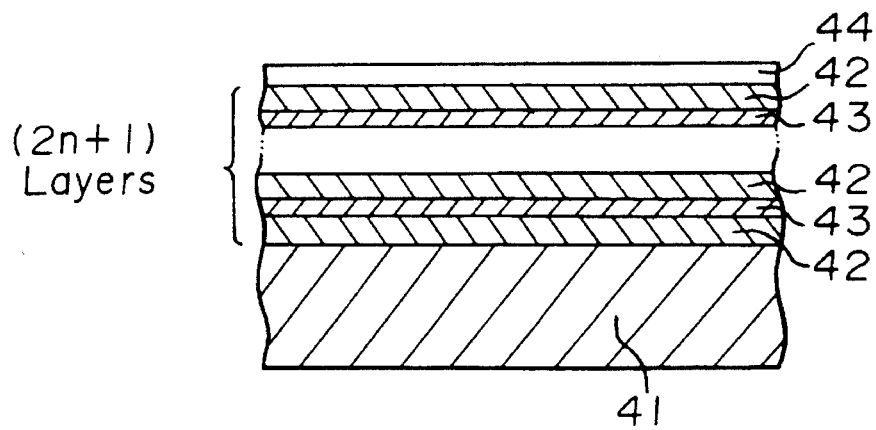

FIG. 6 is a cross-sectional view of another embodiment of the article with high durability according to the present invnetion. Namely, it is a novel heat radiation shielding article which has very high reflectance against lights in the infrared range and adequately high transmittance for lights in the visible light range and yet hardly deteriorates during the storage in a single sheet state or during the transportation to the site where it is processed for lamination. This is a heat radiation shielding article comprising a total of 2n+1 layers (n≧1) of transparent oxide layers and silver layers alternately formed on a transparent substrate, and an amorphous oxide film provided as a protective layer on the outermost layer of said 2n+1 layers.

As the transparent substrate 41 of FIG. 6, glass, a plastic or PET (Polyethylene terephthalate) may be used. As the transparent oxide 42, a material having a relatively large refractive index, e.g. a material having a refractive index of n=1.7–2.5, such as $TiO_2$, $ZrO_2$, $In_2O_3$, $SnO_2$, ZnO, $Ta_2O_5$ or a mixture thereof, is used. With respect to the layered structure of the heat radiation shielding article of FIG. 6, a transparent oxide layer 42 is used as the first layer on the substrate 41, a silver layer 43 is used as the second layer, and a transparent oxide layer 42 is used as the third layer. Thus, the oxide layer 42 and the silver layer 43 are alternately repeated so that the 2n+1 layer will be a transparent oxide layer 42, and an amorphous oxide film 44 is coated as a protective layer on the transparent oxide layer 42 as the 2n+1 layer. The n value of the 2n+1 layer is preferably at most 3 in order to maintain the transmittance for visible lights at a level of at least 70%. The thickness of the transparent oxide layer 42 in a preferred embodiment of the heat radiation shielding article of FIG. 6 may vary depending upon the material used but is generally within the following range. Namely, as the first layer, the thickness is from 200 to 600 Å, as the 2n+1 layer which is the outermost layer of the 2n+1 layer coatings, the thickness is from 100 to 400 Å, and as other intermediate layers, the thickness is from 400 to 1,200

Å. These thickness ranges are prescribed to obtain high transmittance for lights in the visible light range. If the film thicknesses depart from these ranges, the interference conditions will not be maintained, whereby the reflection preventing effects can not be obtained adequately, and the transmittance for visible lights decreases. The transparent oxide layers 42 of the heat radiation shielding article of FIG. 6 are preferably made of the same material from the view point of the productivity. However, the article is not limited to such a preferred embodiment, and any one of such layers may be made of a material different from the rest of the layers, or all layers may be made of different of materials.

On the other hand, the thicknesses of the silver layers 43 should be at most 110 Å to secure adequate transmittance for visible lights and to secure an adequately wide variable range of the reflection color by the adjustment of the layer thicknesses. Namely, if the silver layers 43 become thick, the transmittance for visible lights decreases and it becomes difficult to secure a transmittance of at least 70%. On the other hand, if the silver layers are too thin, silver tends to form discontinuous films, whereby the desired properties will be hardly obtainable, or the product is likely to readily deteriorate. Therefore, the thicknesses of the silver layers should preferably be at least about 60 Å.

There is no particular restriction as to the amorphous oxide film to be used for the heat radiation shielding article of FIG. 6. However, it is preferred to employ the amorphous oxide film of the present invention containing at least one member selected from the group consisting of Zr, Ti, Hf, Ta, Sn and In and at least one member selected from the group consisting of B and Si.

More preferably, the amorphous oxide film may be made of an oxide containing Zr and at least one of B and Si. Particularly, a film of $ZrB_xO_y$ wherein x is $0.05 \leq x \leq 1.0$ and y is $2 < y \leq 3.5$, especially a film of $ZrB_xO_y$ wherein x is $0.05 \leq x \leq 0.8$ and y is $2 < y \leq 3.2$, a film of $ZrSi_zO_y$ wherein z is $0.05 \leq z < 19$ and y is $2.1 \leq y < 40$ and a film of $ZrBxSi_zO_y$ wherein x, z and y are $0.05 \leq x+z$, $z < 19$ and $2 < y < 40$, provided that when $x > 3$, $x \leq 0.25z+3$, are preferred, since they are excellent not only in the scratch resistance and the abrasion resistance but also in the chemical stability.

The amorphous oxide protective film of FIG. 6 may be substituted for the transparent oxide of the 2n+1 layer so that it is in direct contact with the silver layer. However, such an arrangement is not preferred, since such direct contact tends to deteriorate the durability. The reason for the deterioration has not yet been clearly understood, but is considered to be attributable to some side-reaction of boron in the amorphous oxide with the silver. Therefore, it is preferred to interpose a transparent oxide layer between the amorphous oxide film and the silver layer.

The thickness of the amorphous oxide film 44 in FIG. 6 is preferably from 100 to 500 Å, more preferably from 200 to 400 Å, although it is necessary to adjust it in view of the balance with the transparent oxide layers to obtain high transmittance in the visible light range. If the thickness of the amorphous oxide film is smaller than this range, no adequate performance as the protective layer will be obtained. On the other hand, if the thickness exceeds this range, it becomes difficult to attain a transmittance of at least 70% in the visible light range while maintaining the interference conditions.

There is no particular restriction as to the method of forming the heat radiation shielding article of FIG. 6. Vacuum vapor deposition, ion plating or sputtering may be employed. However, a reactive sputtering method excellent in the uniformity, is preferred in the case where coating over a large area is required. It is particularly preferred to prepare all the layers of the heat radiation shielding article including the first layer of a transparent oxide to the protective layer of the amorphous oxide in the same vacuum chamber. However, the article may be taken out in atmospheric air prior to forming the amorphous oxide film, and the amorphous oxide film may be formed thereafter, without adversely affecting the effectiveness.

For the purpose of improving the adhesion and the durability of the heat radiation shielding article of FIG. 6, a boundary layer having a thickness not to adversely affect the optical properties, may be inserted at the interface with the substrate or at the interface between the respective layers. This heat radiation shielding article may be applied to a low emissitivity glass or a door of a freezer show case wherein the article is double-glazed with another substrate with an inner space therebetween and with the amorphous oxide film side located inside, or to a laminated glass for an automobile or for a building construction wherein a substrate having the above coatings and another substrate are laminated with an interlayer disposed therebetween with the amorphous oxide film side located inside.

The protecting mechanism by the amorphous oxide film in the heat radiation shielding article in FIG. 6 is not clearly understood, but is considered to have a merit in that the film is made amorphous by an addition of silicon or boron as an element for constituting glass. Oxidation of silver is believed to be the primary factor for the deterioration mechanism of an infrared reflecting article wherein transparent oxide layers and silver layers are alternately laminated. For the oxidation reaction, oxygen or moisture is required to diffuse, and if the film is crystalline, the grain boundaries constitute the passages for diffusion, whereby the oxidation reaction is facilitated. Therefore, as the protective layer, the amorphous layer free from crystal grain boundaries is utilized as a barrier against diffusion, whereby the durability is believed to be improved.

As described in the foregoing, in the heat radiation shielding article of FIG. 6, the amorphous oxide film is over-coated so that it functions as a barrier layer to prevent the deterioration of the silver layer by oxidation, whereby the durability is improved for a single sheet of an infrared reflecting article wherein transparent oxide layers and silver layers are alternately laminated.

In the present invention, boron or silicon as a glass-constituting element is added in the protective layer, whereby the film is made amorphous, and the smoothness of the film surface is improved and the frictional resistance decreases for an improvement of the abrasion resistance. Therefore, the weatherability of the single sheet is improved, and there is an additional effect observed such that the product is hardly scratched as compared with the conventional article. Further, it is also possible to further increase the effects of the amorphous oxide protective coating by improving the durability of the silver layer by incorporating an additive to the silver layer.

Figure 7:
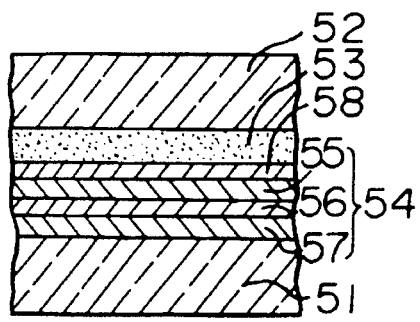
FIGS. 7 and 8 are cross-sectional views of laminated glasses wherein the amorphous oxide films of the present invention are used as metal diffusion barriers.
Figure 8:
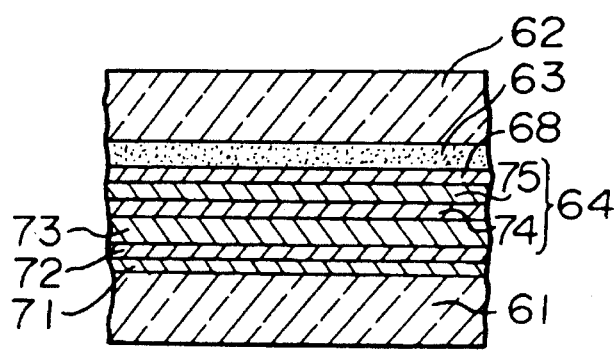

FIGS. 7 and 8 show other embodiments wherein the amorphous oxide film of the present invention is used as a metal diffusion barrier layer. Namely, these Figures are cross-sectional views of laminated structures wherein a glass sheet having a transparent conductive film composed of one or more layers including a metal layer and other glass sheet are lamianted with a plastic interlayer disposed therebetween with such a transparent conductive film located inside, wherein an amorphous oxide layer is disposed between the transparent conductive film and the plastic interlayer, as a barrier to prevent the diffusion of the metal in the transparent conductive film.

Such an amorphous oxide layer as a barrier is interposed to overcome conventional problems in laminated glass such that upon expiration of a long period of time, turbidity occurs. Inventors of the present invention have found that such turbidity takes place because the metal in a metal layer in the transparent conductive film diffuses and react with moisture or oxygen contained in a small amount in the plastic interlayer, so that the metal is oxidized.

As such an amorphous oxide barrier film, it is preferred to employ the amorphous oxide film of the present invention composed essentially of an oxide containing at least one member selected from the group consisting of Zr, Ti, Hf, Ta, Sn and In and at least one member selected from the group consisting of B and Si.

FIG. 7 is a cross-sectional view of an embodiment of such a laminated glass structure. Between a glass sheet 51 located at the exterior side of a vehicle and a glass sheet 52 located at the interior side of the vehicle, a plastic interlayer 53 is disposed to bond these glass sheets 51 and 52.

At the bonding surface of either one of these glass sheets 51 and 52, preferably at the bonding surface of the glass sheet 51 located at the exterior side of the vehicle, a transparent conductive film 54 and an amorphous oxide film 58 as a barrier are disposed so that the amorphous oxide film 58 as the barrier is located at the side of the plastic interlayer 53.

In this case, the above transparent conductive film 54 is formed to have a multi-layered structure such as ZnO/Ag/ZnO or $SnO_2$/Ag/$SnO_2$ wherein a metal film 56 such as Ag or Au is sandwitched between dielectric films 55 and 57. Between this transparent conductive film 54 and the above-mentioned palstic interlayer 53, an amorphous oxide film 58 as a barrier formed by the amorphous oxide film of the present invention such as a $ZrB_xO_y$ film having a thickness of from 10 to 100 Å, is disposed.

As the above-mentioned dielectric films 55 and 57 in the present invention, a $TiO_2$ film or a ITO film may also be used as the case requires.

FIG. 8 is a cross-sectional view of another embodiment of a laminated glass structure, wherein the rear side electrode of a solar cell is made of the transparent conductive film of the present invention. Namely, on a glass sheet 61 through which incident light enters into the solar cell, an alkali barrier film 71 made of e.g. $SiO_2$ or $Al_2O_3$, a first transparent electrode 72 made of $SnO_2$ or ITO, an a-Si film 73 and a rear side electrode (transparent conductive film) 64 are sequentially formed. Then, the amorphous oxide film 68 as a barrier is formed on said rear side electrode 64, so that, when such a glass sheet 61 and a glass sheet 62 at the inerior side of the vehicle are bonded with a plastic interlayer 63 interposed therebetween, the amorphous oxide film 68 as a barrier is disposed between the transparent conductive film 64 and the interlayer 63.

Such a transparent conductive film 64 as the rear side electrode may be composed of two or more layers such as a metal film 74 and other film 75, or may be composed solely of one layer of the metal film 74.

Such a metal layer 74 may be a layer made of Ag, Au, Pd or Al or an alloy film made of at least two different kinds of these metals. Further, said other film 75 may be a film made of ZnO, ZnS, $TiO_2$, ITO or $SnO_2$.

A suitable method such as spraying, vacuum deposition, DC sputtering or chemical vapor deposition, may be used as the method of forming the above-mentioned transparent conductive films 54 and 64 or the amorphous oxide barrier films 58 and 68. However, in view of the productivity and the film properties, it is preferred to form films by the DC sputtering method. A multi-layered film thereby formed preferably has a three-layered structure such as $ZnO_x$/Ag/$ZnO_x$ or $SnO_x$/Ag/$SnO_x$ from the viewpoint of the deposition speed or the cost of the target, or Ag/$ZnO_x$ in the case of the rear electrode of a solar cell. For the preparation of such a laminated glass, a glass sheet may preliminarily be molded into a desired shape prior to the formation of the films, or the films are preliminarily formed and then the glass sheet may be molded into a desired shape.

The amorphous oxide barrier films 58 and 68 are preferably formed in a thickness of from 10 to 100 Å. If they are thinner than this range, no adequate metal diffusion preventing ability will be obtained. On the other hand, if they are thicker than 100 Å, no further improvement of the metal diffusion preventing ability will be observed.

As the plastic interlayers 53 and 63 to be used for bonding glass sheets 51 and 52 or 61 and 62, PVB, EVA (ethylene-vinyl acetate copolymer) or urethane may be used. For the formation of a laminated glass for an automobile, it is preferred to employ PVB having excellent adhesiveness.

In FIGS. 7 and 8, laminated glass structures are illustrated wherein two glass sheets are used. However, the present invention may also be applied to a laminated glass wherein three or more glass sheets are used. In such a case, the above-mentioned transparent conductive films 54 and 64 and the amorphous oxide barrier films 58 and 68 are preferably formed on the bonding surface of the glass sheet located at the exterior side of a vehicle i.e. at the outermost side.

Having such constructions, the embodiments of FIGS. 7 and 8 are capable of effectively suppressing turbidity by the functions of the metal oxide films 58 and 68 interposed as barriers.

To ascertain the effects of the present invention, experiments have been conducted in comparison with Comparative Examples. The results are shown in Table 3.

TABLE 3

| Layered structures (The numerical values indicate layer thicknesses (Å).) | After UV irradiation for 100 hours Turbidity |
|---|---|
| Comparative Examples | |
| PVB/ITO/Glass<br>500 | Nil |
| PVB/$SnO_2$/Glass<br>500 | Nil |
| PVB/ZnO/Ag/ZnO/Glass<br>450 100 450 | Observed |
| PVB/$SnO_2$/Ag/$SnO_2$/Glass<br>450 100 450 | Observed |
| Examples | |
| PVB/$ZrB_xO_y$/ZnO/Ag/ZnO/Glass<br>50 450 100 450 | Nil |
| PVB/$ZrB_xO_y$/ZnO/Ag/a-Si/$SnO_2$/$SiO_2$/Glass<br>50 400 200 4000 6000 800 | Nil |

TABLE 3-continued

| Layered structures (The numerical values indicate layer thicknesses (Å).) | After UV irradiation for 100 hours Turbidity |
|---|---|
| PVB/ZrB$_x$O$_y$/Ag/a-Si/SnO$_2$/SiO$_2$/Glass<br>400   200   4000 6000   800 | Nil |

As shown in Table 3, no change with respect to the turbidity was observed even in the Comparative Examples where the transparent conductive film 54 or 64 was made of a single layer of a ITO film or a SnO$_2$ film. However, when the transparent conductive film is made of a multi-layered film such as a three layered film of ZnO/Ag/ZnO or SnO$_2$/Ag/SnO$_2$ wherein the silver layer is sandwitched by dielectric layers, turbidity occurred by UV irradiation for 100 hours. It is anticipated that such turbidity has resulted because a metal (such as silver) in the metal layer (such as the silver layer) was activated by the UV irradiation and penetrated through the dielectric layers (such as the ZnO film and the SnO$_2$ film) and diffused to the PVB film, whereby the metal is oxidized by the moisture or oxygen contained in the PVB film.

On the other hand, no turbidity was observed after the UV irradiation for 100 hours, when an amorphous oxide barrier film was interposed between the transparent conductive film (as identified in the Table by ~) composed of one or more layers including a metal layer and the PVB film, to prevent the diffsion of the metal from such a transparent conductive film to the PVB film as in the case of the Examples of the present invention in Table 3. Thus, it has been confirmed that the interposition of such an amorphous oxide barrier film is very effective to suppress the formation of turbidity.

In the embodiments of FIGS. 7 and 8, the diffusion of the metal can adequately be prevented, since the amorphous oxide barrier film has an adequately dense structure. Whereas, with the crystalline film, the crystal grain boundaries are believed to constitute the passages for diffusion, whereby oxidation is facilitated.

Figure 9:
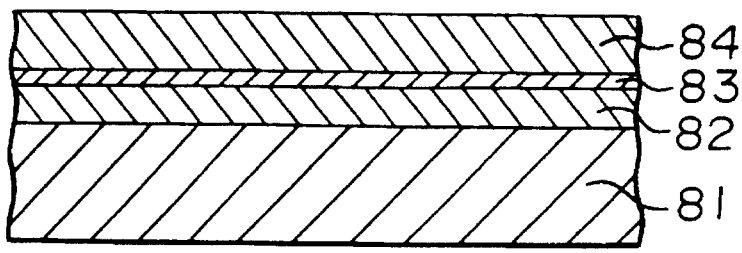

FIG. 9 is a cross-sectional view of a heat radiation shielding glass prepared by a process whereby the optical properties of the article with high durability of the present invention is stabilized, whereby the following problems have been overcome.

It is common to employ a direct current (DC) sputtering method when a coating is applied to a glass sheet having a large area useful for e.g. automobiles or building construction. When an oxide film is formed by this method, electric conductivity is required for the target. Therefore, it is usual to employ a metal target although there is an exception such as use of ITO or Al-doped ZnO. During the formation of an oxide film by the reactive sputtering in an oxygen plasma atmosphere, it is unavoidable that a part of the previously formed heat radiation shielding layer is oxidized. The degree of the oxidation can hardly be controlled by the technique presently available. Consequently, there has been a problem that the optical properties are varied.

Under these circumstances, the present inventors have found a process of forming a thin barrier layer to prevent such oxidation of the heat radiation shielding layer, on the heat radiation shielding layer, prior to the formation of an oxide film on the heat radiation shielding layer.

FIG. 9 is a cross-sectional view of an embodiment of a heat radiation shielding glass prepared by such a process, wherein a reference numeral 81 indicates a substrate made of transparent or colored glass or plastic, numeral 82 is a heat radiation shielding film made of e.g. a metal, a nitride, a carbide, an absorptive oxide or a mixture thereof, numeral 83 indicates an oxidation barrier film, and numeral 84 indicates an oxide film.

The most signigicant feature of this process is to form a thin oxidation barrier film 83 on the heat radiation reflecting film 82 to prevent the oxidation of the film 82. There is no particular restriction as to the film material of this barrier film 83. However, in a case where the film-forming is conducted in a multi path mode by usual sputtering, a metal film or a nitride film capable of being formed from a target useful also for the heat radiation reflecting film or for the oxide film formed on the atmospheric air side, is preferred in view of the productivity. If the film thickness is too thin, no adequate barrier effects will be obtained, and a part of the heat radiation reflecting film 82 will be oxidized when the outermost oxide film 4 is formed by reactive sputtering. On the other hand, if the film is too thick, it will remain as not completely oxidized, whereby the transmittance will be low. Therefore, the film thickness is preferably from 5 to 30 Å, more preferably from 10 to 20 Å.

The embodiment of FIG. 9 has at least three-layered structure as mentioned above. However, in some cases, one or more layers may be formed between the substrate 81 and the radiation reflecting film 82 or between the oxidation barrier film 83 and the oxide film 84, to improve the adhesion or to adjust the optical properties.

The oxide film 84 is preferably the amorphous oxide film of the present invention, particularly the oxide film containing Zr and at least one of B and Si. However, the oxide film 84 is not limited to such specific examples and may contain other components to improve the durability, to adjust the optical properties or to improve the speed and the stability for the film-forming. The oxide film of the present invention may not necessarily be transparent and may be an absorptive film in an oxygen-lacking state or may contain a small amount of nitrogen or carbon.

There is no particular restriction as to the oxide film 84. However, the oxide film containing Zr and at least one of B and Si, is suitable particularly for an application where high durability is required, since such an oxide film is excellent in the scratch resistance and in the chemical stability. When the oxide film 84 contains Zr and at least one of B and Si, there is no particular restriction as to the respective proportions. However, if the content of B or Si is small, the film tends to be crystalline, whereby the surface smoothness tends to be inadequate. Consequently, the scratch resistance tends to be poor. Therefore, the atomic ratio of B, Si or the total amount thereof to Zr is preferably at least 0.05. Specifically, a film of ZrB$_x$O$_y$ wherein x is $0.05 \leq x \leq 1.0$ and y is $2 < y \leq 3.5$, a film of ZrSi$_z$O$_y$ wherein z is $0.05 \leq z < 19$ and y is $2.1 \leq y < 40$ and a film of ZrB$_x$Si$_z$O$_y$ wherein x, z and y are $0.05 \leq x+z$, $z<19$ and $2<y<40$, provided that when $x>3$, $x \leq 0.25$ $z+3$, are preferred, since they are excellent in the scratch resistance, the abrasion resistance and the chemical stability.

There is no particular restriction as to the thickness of the oxide film 84. However, if the oxide film is too thin, no adequate durability will be obtained. Therefore, the thickness is preferably at least 50 Å, more preferably at least 100 Å, most preferably at least 150 Å, although it depends upon the particular purpose. On the other hand, if the oxide layer is too thick, the productivity will be poor, and the interference effects will result, whereby the reflection color tends to be strong. Therefore, the thickness is usually at most 1,000

Å, preferably at most 700 Å, more preferably at most 500 Å, although it depends upon the refractive index.

There is no particular restriction as to the method of forming the oxide film 84. Vacuum vapor deposition, ion plating or sputtering may be employed.

There is no particular restriction as to the film material of the heat radiation reflecting film 82. It may be selected from the group consisting of metals, nitrides, carbides, absorptive oxides and mixtures thereof, depending upon the particular purpose or the required specification. Usually, the heat radiation reflecting film 82 is selected from the group consisting of titanium, chromium, zirconium, titanium nitride, chromium nitride and zirconium nitride.

When the heat radiation reflecting film 82 is made of a nitride film, it is effective to form an oxide in order to increase the adhesion with the substrate 81.

In this method, the oxidation barrier film 83 effectively prevent the heat radiation reflecting layer 82 from being partially oxidized in the oxygen plasma atmosphere during the formation of an oxide film 84 by the reactive sputtering, in such a manner that the barrier film 83 itself is oxidized. As a result, a heat radiation shielding glass having constant optical properties can readily be produced.

On the other hand, if this oxidized barrier layer is not formed, a part of the heat radiation reflecting film 82 such as Ti will be partially oxidized to form $TiO_2$, whereby the reflectance increases, and the color tone will not only be changed but also hardly be reproduced constantly.

It is preferred that as the oxidation barrier layer 83, the same metal as used in the oxide film formed thereon is employed, since the oxide film will have a composition where the degree of oxidation continuously changes at the side being in contact with the heat radiation reflecting film, whereby the adhesion between the oxidation barrier layer 83 and the oxide film 84 is increased. It is further preferred that almost all of the metal of the oxidation barrier layer 83 is oxidized during the formation of the oxide film so that the structure will be the same as a double layered structure from the optical point of view.

For example, when a $ZrB_xO_y$ film is to be formed as the oxide film, it is possible to constantly obtain a heat radiation shielding glass having a structure of substrate/heat radiation reflecting film/$ZrB_xO_y$ if a thin $ZrB_2$ film is formed as the oxidation barrier layer 83 on the heat radiation reflecting film prior to the formation of the $ZrB_xO_y$ film.

The method of forming the oxidation barrier layer as described above can be applied to the production of other than the heat radiation shielding glass illustrated in FIG. 9. Namely, such an oxidation barrier layer may be formed, for example, between the first layer 2 and the second layer 3 in FIG. 2, between the second layer 12 and the third layer 13 in FIG. 3, between the first layer 22 and the second layer 23 in FIG. 4, between the first layer 32 and the second layer 33 in FIG. 5, between the 2n layer 43 and the 2n+1 layer in FIG. 6, and in the case where the transparent conductive films 54 and 64 in FIGS. 7 and 8 are non-oxides, between said layers and the barrier layers 58 and 59, to obtain optically stable articles with high durability according to the present invention in a similar manner.

The amorphous oxide film of the present invention may be formed as a layer for a scratch resistant protective film on one side or each side of the transparent substrate to obtain a transparent sheet provided with a scratch resistant protective film.

Figure 10:
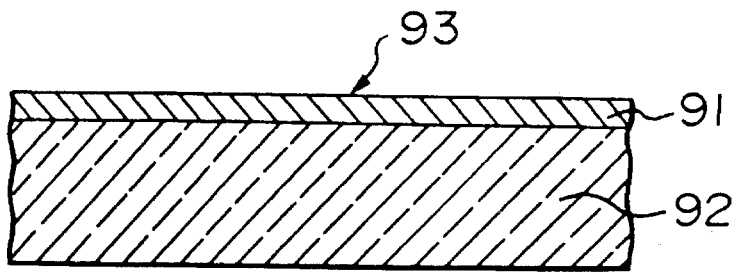

FIG. 10 illustrates a diagrammatical cross-sectional view of an embodiment of such a scratch resistant protective film-provided transparent sheet.

The transparent substrate 92 to be used in the present invention may be made of soda lime glass, borosilicate glass, lead silicate glass, aluminosilicate glass, aluminoborate glass, quartz glass, barium borate glass or any other solid glass material without any particular restriction as to the composition. Further, it is also possible to employ a plastic substrate. The shape of the substrate is not restricted to a flat plate, and the substrate may have a curved shape or any other shape. From the viewpoint of safety, a glass substrate is preferably the one strengthened by air cooling reinforcement or chemical reinforcement, or the one treated by lamination to prevent scattering of glass fragments upon breakage.

The thickness of the scratch resistant protective film 91 is preferably from 100 to 5,000 Å. If the film is too thin, no adequate scratch resistance will be obtained. On the other hand, if it is too thick, peeling of the film is likely to occur, and the productivity tends to be poor.

The scratch resistat protective film 91 is preferably the amorphous oxide film of the present invention. Particularly preferred are a film of $ZrB_xO_y$ wherein x is $0.05 \leq x \leq 1.0$ and y is $2 < y \leq 3.5$, a film of $ZrSi_zO_y$ wherein z is $0.05 \leq z < 19$ and y is $2.1 \leq y < 40$ and a film of $ZrB_xSi_zO_y$ wherein x, z and y are $0.05 \leq x+z$, $z < 19$ and $2 < y < 40$, provided that when $x > 3$, $x \leq 0.25z+3$, since they are excellent not only in the scratch resistance and the abrasion resistance but also in the chemical stability. Such an oxide film containing Zr and B and/or Si is not limited to the four component system of Zr, B, Si and O and may further contain other components to improve the durability, to adjust the optical properties or to improve the speed and the stability for film-forming.

The contents of B and/or Si and the thickness of the scratch resistant protective film 91 are suitablly selected depending upon the particular purpose of the transparent sheet. For example, in the case of glass to be used for the read out portion of a bar cord reader, it is preferred to use soda lime glass having a thickness of 5 mm with a $ZrB_xO_y$ film having a thickness of from 300 to 600 Å in view of the transmittance for a laser beam having a wavelength of 6328 Å.

Figure 11:
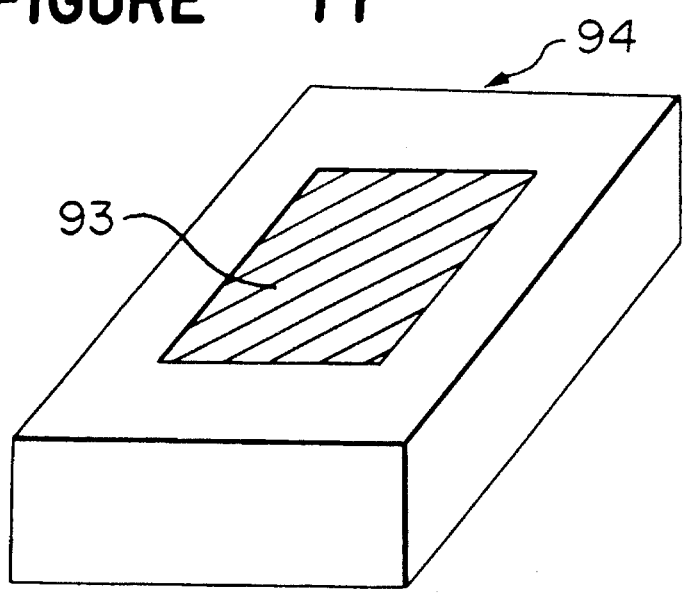
FIG. 11 shows a diagrammatical view of a bar code reader.

As the method of forming the scratch resistant protective film 91 of the present invention, a film-forming method such as vapor deposition, sputtering or ion plating may be employed. There is no particular restriction as to the method for its formation. However, the sputtering method is preferred among them, since the starting material may not thereby be melted, the film composition can easily be controlled or reproduced, the energy of particles reaching the substrate is high, and it is possible to obtain a film having good adhesion, whereby the amorphous film of the present invention can readily be obtained. To improve the adhesion of the film to the substrate, an ion injection method may be used in combination. Namely, argon ions or oxygen ions with a high energy at a level of a few 10 keV may be irradiated on the protective film 91 formed on a glass substrate, to form a mixed layer between the protective film and the glass substrate to increase the adhesion to the glass substrate. Further, depeding upon the particular purpose, it is also effective to reduce the frictional coefficient by coating a thin organic lubricating film on the protective film 91. As an application of the scratch resistant protective film-provided transparent sheet of FIG. 10, a cover glass (also called a scanner glass) for the read out portion of a bar cord reader may primarily be mentioned. FIG. 11 shows a diagrammatical view of a bar cord reader. Reference numeral 93 indicates the glass for the read out portion of the bar cord reader. Reading out of a bar cord is conducted by sliding a commercial good having a bar cord labelled thereon, on the bar cord reader 94. The transparent sheet of FIG. 10 may be used also for other purposes, for example, as a glass plate for a stand table for a copying machine or as a transparent sheet in general where scratch resistance is required.

Now, the present invention will be described in further detail with reference to Examples and Comparative Examples.

The following Examples and Comparative Examples are directed to articles with high durability as illustrated in FIGS. 2 and 3.

EXAMPLE 1

A glass substrate was placed in a vacuum chamber of a sputtering apparatus, and the vacuum chamber was evacuated to a pressure of $1\times10^{-6}$ Torr. A gas mixture of argon and nitrognen was introduced to bring the pressure to $2\times10^{-3}$ Torr. Then, titanium was subjected to reactive sputtering to form titanium nitride (first layer) in a thickness of about 200 Å. Then, the gas was changed to a gas mixture of argon and oxygen, and the pressure was adjusted to $2\times10^{-3}$ Torr. Then, a zirconium/boron target (atomic ratio 70/30) was subjected to reactive sputtering to form an amorphous oxide film comprising zirconium and boron. $ZrB_xO_y$ (second layer, x=0.14, y=2.21) in a thickness of about 500 Å.

The visible light transmittance $T_V$, the solar energy transmittance $T_E$, the visible light reflectance on the coating surface $R_{VF}$ and the visible light reflectance on the glass surface $R_{VG}$ of the heat radiation reflecting glass thus obtained, were 53%, 42%, 6% and 28%, respectively. The film was immersed in a 1N hydrochloric acid or sodium hydroxide for 6 hours or in boiling water for two hours to examine the durability. In each case, the changes in the transmittance and in the reflectivity were within 1%.

In the scratch test by means of an abrasive eraser, no substantial scratch mark was observed, and the film showed excellent scratch resistance.

EXAMPLE 2

In the same manner as in Example 1, titanium nitride (first layer) was formed in a thickness of about 200 Å on a glass substrate. Then, the gas was changed to a gas mixture of argon and oxygen, and the pressure was adjusted to $2\times10^{-3}$ Torr. Then, a zirconium/boron target (atomic ratio 33/67) was subjected to reactive sputtering to form an amorphous oxide film comprising zirconium and boron $ZrB_xO_y$ (second layer, x=0.99, y=3.49) in a thickness of about 500 Å. The optical properties $T_V$, $T_E$, $R_{VF}$ and $R_{VG}$ of the heat radiation reflecting glass thus obtained, were 55%, 42%, 3% and 20%, respectively.

The durability tests were conducted in the same manner as in Example 1, and the film exhibited similarly excellent properties.

EXAMPLE 3

A glass substrate was placed in a vacuum chamber of a sputtering apparatus. The chamber was evacuated to a pressure of $1\times10^{-6}$ Torr. A gas mixture of argon and oxygen was introduced to bring the pressure to $2\times10^{-3}$ Torr. While heating the substrate at a temperature of about 350° C., a ITO target was subjected to sputtering to form ITO (first layer) in a thickness of about 1 µm. Then, by changing the proportions of the gas mixture of argon and oxygen, a zirconium/boron target (atomic ratio 33/67) was subjected to reactive sputtering to form an amorphous oxide film $ZrB_xO_y$ (second layer x=0.99, y=3.49) in a thickness of about 760 Å.

The durability of the heat radiation reflecting glass thus obtained was evaluated in the same manner as in Example 1, whereby it showed excellent durability.

EXAMPLE 4

A glass substrate was placed in a vacuum chamber of a sputtering apparatus. The chamber was evacuated to a pressure of $1\times10^{-6}$ Torr. A gas mixture of argon and oxygen was introduced to bring the pressure to $2\times10^{-3}$ Torr. Then, tantalum was subjected to reactive sputtering to form tantalum oxide (first layer) in a thickness of about 620 Å. Then, a zirconium/boron target (atomic ratio 33/67) was subjected to reactive sputtering in the same manner to form an amorphous oxide film $ZrB_xO_y$ (second layer x=0.99, y=3.49) in a thickness of about 760 Å.

The vacuum was released, and the substrate was overturned. Then, similar two layers were formed on the rear side in the same manner.

The reflectance of the low reflective glass thus obtained was about 1.5%. The durability was excellent as in the case of Example 1.

EXAMPLE 5

A glass substrate was placed in a vacuum chamber of a sputtering apparatus. The chamber was evacuated to a pressure of $1\times10^{-6}$ Torr. A gas mixture of argon and oxygen was introduced to bring the pressure to $2\times10^{-3}$ Torr. Then, a zirconium target containing boron (Zr:B=70:30) was subjected to RF (radio frequency) magnetron sputtering to form an amorphous oxide film $ZrB_xO_y$ (first layer x=0.14, y=2.21) in a thickness of about 600 Å. Then, the gas was changed to a gas mixture of argon and nitrogen, and the pressure was adjusted to $2\times10^{-3}$ Torr. Then, a titanium target was subjected to high frequency magnetron sputtering to form titanium nitride (second layer) in a thickness of about 120 Å. Then, under the same condition as in the first layer, a $ZrB_xO_y$ film (third layer x=0.14, y=2.21) was formed in a thickness of about 600 Å.

The visible light transmittance $T_V$ and the solar energy transmittance $T_E$ of the sample thus obtained were about 80% and about 60%, respectively. Durability tests were conducted in the same manner as in Example 1, and the sample showed excellent properties as in Example 1.

EXAMPLE 6

A glass substrate was placed in a vacuum chamber of a sputtering apparatus. The chamber was evacuated to a pressure of $1\times10^{-6}$ Torr. A gas mixture of argon and oxygen was introduced to bring the pressure to $2\times10^{-3}$ Torr. Then, a titanium target containing silicon was subjected to high frequency magnetron sputtering to form an amorphous oxide film $TiSi_xO_y$ (first layer x=0.33, y=2.66) in a thickness of about 600 Å. Then, the gas was changed to a gas mixture of argon and nitrogen, and the pressure was adjusted to $2\times10^{-3}$ Torr. Then, a titanium target was subjected to high frequency magnetron sputtering to form titanium nitride (second layer) in a thickness of about 120 Å. Then, under the same condition as in the case of the first layer, an amorphous oxide film $TiSi_xO_y$ (third layer x=0.33, y=2.66) was formed in a thickness of about 600 Å. The visible light transmittance and the sunlight transmittance of the sample thus obtained were substantially the same as in Example 5. The durability was also substantially the same as in Example 5.

COMPARATIVE EXAMPLE 1

To ascertain the effects of Example 5, a zirconium oxide film containing no boron (first layer) was formed in a thickness of about 600 Å. Then, the gas was changed to a gas mixture of argon and nitrogen, and the pressure was adjsuted to $2\times10^{-3}$ Torr. Then, a titanium target was subjected to high frequency magnetron sputtering to form titanium nitride (second layer) in a thickness of about 120 Å. Then, under the same condition as in the case of the first layer, a zirconium oxide film (third layer) was formed in a thickness of about 600 Å.

The sample thus obtained was subjected to the abrasion eraser test, whereby a number of scratch marks were observed, showing poor scratch resistance and abrasion resistance.

COMPARATIVE EXAMPLE 2

To ascertain the effects of Example 6, a titanium oxide film containing no silicon (first layer) was formed in a thickness of about 600 Å. The gas was changed to a gas mixture of argon and nitrogen, and the pressure was adjusted to $2\times10^{-3}$ Torr. Then, a titanium target was subjected to high frequency magnetron sputtering to form titanium nitride (second layer) in a thickness of about 120 Å. Then, under the same condition as in the case of the first layer, a titanium oxide film (third layer) was formed in a thickness of about 600 Å.

The sample thus obtained was subjected to the abrasion eraser test, whereby a number of scratch marks were observed, showing poor scratch resistance and abrasion resistance.

Now, Examples of the article with high durability shown in FIG. 4 will be given.

EXAMPLE 7

A glass substrate was placed in a vacuum chamber of a sputtering apparatus. The chamber was evacuated to a pressure of $1\times10^{-6}$ Torr. As a glass substrate, a blue glass substrate having a thickness of 4 mm was used. The same glass substrate was used also in Example 8 et seq. Then, a gas mixture of argon and nitrogen was introduced to bring the pressure to $2\times10^{-3}$ Torr. Then, titanium was subjected to reactive sputtering to form titanium nitride (first layer) in a thickness of about 20 Å. Then, the gas was changed to a gas mixture of argon and oxygen, and the pressure was adjusted to $2\times10^{-3}$ Torr. Then, a $ZrB_2$ target was subjected to reactive sputtering to form an oxide film comprising zirconium and boron (second layer) in a thickness of about 200 Å. The visible light transmittance $T_V$, the the solar energy transmittance $T_E$, The visible light reflectance on the coating surface $R_{VF}$, the visible light reflectance on the glass surface $R_{VG}$ and color changes in the transmittance and in the reflectance $\sqrt{(\Delta x)^2+(\Delta y)^2}$ of the heat radiation shielding glass thus obtained, were 71%, 56%, 13%, 12%, 0.0068 and 0.026, respectively.

The transmission color and the reflection color were neutral to such an extent that there was no substantial distinction from the base glass sheet.

The heat radiation shielding glass was immersed in 1N hydrochloric acid or sodium hydroxide for 6 hours or in boiling water for two hours to examine the durability of the film, whereby no change in the optical properties was observed.

In the abrasion test by means of an abrasive eraser, no substantial scratch mark was observed, and thus the film showed excellent scratch resistance.

EXAMPLE 8

In the same manner as in Example 7, zirconium was subjected to reactive sputtering to form zirconium nitride (first layer) on a glass substrate in a thickness of about 20 Å. Then, the gas was changed to a gas mixture of argon and oxygen, and the pressure was adjusted to $2\times10^{-3}$ Torr. Then, a zirconium/boron target (atomic ratio 20/80) was subjected to reactive sputtering to form an oxide film $ZrB_xO_y$ comprising zirconium and boron (second layer x=1.78, y=4.67) in a thickness of about 200 Å.

The optical properties $T_V$, $T_E$, $R_{VF}$, $R_{VG}$ and the color changes in the transmittance and in the reflectance of the heat radiation shielding glass thus obtained, were 71%, 55%, 12%, 12%, 0.0067 and 0.026, respectively.

The heat radiation shielding glass was immersed in 1N hydrochloric acid or sodium hydroxide for 6 hours or in boiling water for two hours to examine the durability of the film of this Example, whereby no change in the optical properties was observed. The durability test was conducted in the same manner as in Example 7, whereby the film showed excellent properties as in Example 7.

EXAMPLE 9

In the same manner as in Example 7, chromium was subjected to reactive sputtering to form chromium nitride (first layer) on a glass substrate in a thickness of about 10 Å. Then, the gas was changed to a gas mixture of argon and oxygen, and the pressure was adjusted to $2\times10^{-3}$ Torr. Then, a target containing $ZrB_2$ and SiC was subjected to reactive sputtering to form an oxide film $(ZrB_xSi_zO_y)$ containing zirconium, boron and silicon (second layer x=0.99, z=0.41, y=4.31) in a thickness of about 200 Å. The optical properties $T_V$, $T_E$, $R_{VF}$, $R_{VG}$ and the color changes in transmittance and the reflectance of the heat radiation shielding glass thus obtained, were 72%, 58%, 10%, 9%, 0.0074 and 0.029, respectively.

The transmission color and the reflection color were not substantially distinguished from those of the base glass sheet. The durability was also excellent as in Example 7.

EXAMPLE 10

Instead of titanium nitride in Example 7, chromium, titanium or zirconium was formed as the first layer in a thickness of about 10 Å. A $ZrB_2$ target was subjected to reactive sputtering to form an oxide film containing zirconium and boron (second layer) thereon in a thickness of about 200 Å, to obtain three types of heat radiation shielding glasses. With respect to $T_V$, $T_E$, $R_{VF}$ and $R_{VG}$ of these glasses, there was no substantial difference among chromium, titanium and zirconium, and they were 72%, 58%, 11% and 10%, respectively. The color changes in the transmission color and the reflection color were from 0.0031 to 0.0065 and from 0.028 to 0.030, respectively, i.e. as excellent as in Example 7. The durability was also excellent as in Example 7.

Now, Examples for the articles with high durability as shown in FIGS. 5 and 9 will be given.

EXAMPLE 11

In the same manner as in Example 7, titanium nitride (first layer) was formed in a thickness of 20 Å. Then, as an oxidized barrier layer for the titanium nitride, a $ZrB_2$ film (second layer) was formed in a thickness of 15 Å in an argon atmosphere by using a $ZrB_2$ target. Then, the gas was changed to a gas mixture of argon and oxygen, and the pressure was adjusted to $2\times10^{-3}$ Torr. A $ZrB_2$ target was subjected to reactive sputtering to form a $ZrB_xO_y$ film (third layer x=0.99, y=3.49) in a thickness of 60 Å. Further, a target having a composition of $Zr_{70}B_{30}$ was subjected to reactive sputtering in a gas mixture of argon and oxygen to form a $ZrB_xO_y$ film (fourth layer x=0.14, y=2.21) in a thickness of 80 Å.

The optical properties $T_V$, $T_E$, $R_{VF}$ and $R_{VG}$ of the heat radiation shielding glass thus obtained, were 72%, 57%, 11% and 8%, respectively.

The heat radiation shielding glass was immersed in 0.1N $H_2SO_4$, 0.1N NaOH and water of 100° C. for 200 hours, 200 hours and two hours, respectively. In each case, the changes in the transmittance and the reflectance were within 1%.

In the abrasion test by means of an abrasive eraser, no substantial scratch mark was observed, and the film showed excellent scratch resistance.

EXAMPLE 12

Chromium was subjected to reactive sputtering in a gas mixture of argon, nitrogen and oxygen to form a $CrN_xO_y$ film (first layer) on a glass substrate in a thickness of 20 Å, and the second to fourth layers were formed in the same manner as in Example 11 to obtain a heat radiation shielding glass.

Its optical properties $T_V$, $T_E$, $R_{VF}$ and $R_{VG}$ were 71%, 59%, 10% and 9%, respectively. Its durability was as excellent as in Example 11.

EXAMPLE 13

In the same manner as in Example 11, 20 Å of a TiN film (first layer) and 15 Å of a $ZrB_2$ film (second layer) were formed. Then, in an atmosphere of argon and oxygen ($2\times10^{-3}$ Torr), a $ZrB_2$ target was subjected to reactive sputtering to form a $ZrB_xO_y$ film (third layer x=0.99, y=3.49) in a thickness of about 200 Å. The optical properties $T_V$, $T_E$, $R_{VF}$ and $R_{VG}$ of the radiation shielding glass thus obtained, were 71%, 56%, 10% and 9%, respectively. The rests of the properties were substantially the same as in Example 11.

Now, Examples and Comparative Examples for the article with high durability as shown in FIG. 6 will be given.

EXAMPLE 14

On a cathode of a magnetron DC sputtering apparatus, targets of metal Zn, metal Ag and Zr-B (Zr/B=7/3) were placed. A soda lime glass substrate having a thickness of 2 mm was throughly cleaned by e.g. polishing, dried and then placed in a vacuum chamber. The chamber was evacuated to a pressure of $1\times10^{-5}$ Torr by an oil diffusion pump. Here, no heating of the substrate was conducted. Then, oxygen gas was introduced to the vacuumed system to bring the pressure to $3.0\times10^{-3}$ Torr. In this state, a power of 5.2 W/cm² was applied to the metal Zn target to form a ZnO film in a thickness of 400 Å. Then, the atmosphere in the vacuumed system was replaced completely by 100% pure argon gas, and the pressure was adjusted to $3.5\times10^{-3}$ Torr. In this state, a power of 0.8 W/cm² was applied to the metal Ag target to form a Ag film in a thickness of 150 Å. Then, the atmosphere in the vacuumed system was again changed to 100% oxygen gas, and a ZnO film was formed in a thickness of 200 Å under a pressure of $3.0\times10^{-3}$ Torr. Finally, the atmosphere in the vacuumed system was changed to a gas mixture of $Ar/O_2=7/3$, and a power of 7.8 W/cm² was applied to the Zr-B target Zr:B=70:30 under a pressure of $3.5\times10^{-3}$ Torr to form a $ZrB_xO_y$ (x=0.14, y=2.21) film in a thickness of 200 Å as a protective layer. The visible light transmittance of the sample thus obtained was 75.9%. This sample was left to stand in an atmosphere at 50° C. under a relative humidity of 95% for 46 hours, whereupon the visible light transmittance changed to 77.4%, but no change was observed by the visual inspection. A finger print was intentionally put on the surface of the film, and the sample was left to stand in an atmosphere at 60° C. under a relative humidity of 95% for 19 hours, whereupon small pinholes were slightly observed at the finger printed portion.

EXAMPLE 15

In the same manner as in Example 14, a ZnO film was formed in a thickness of 400 Å as the first layer, a Ag film was formed in a thickness of 100 Å as the second layer, a ZnO film was formed in a thickness of 800 Å as the third layer, and a Ag film was again formed in a thickness of 100 Å as the fourth layer, and a ZnO film was formed in a thickness of 100 Å as the fifth layer. Then, also in the same manner as in Example 14, a $ZrB_xO_y$ film (x=0.14, y=2.21) was formed thereon in a thickness of 300 Å as a protective layer. The visible light transmittance of the sample thus obtained was 80.2%. This sample was left to stand in an atmosphere at 50° C. under a relative humidity of 95% for 53 hours, whereupon the transmittance was 80.1%, and no change was observed by visual inspection. The same sample was left to stand in a weatherometer for 36 hours, whereupon the transmittance was 78.6%, and by visual inspection, only an extremely slight haze was observed at the end portion and no change was observed at the central portion.

COMPARATIVE EXAMPLE 3

In the same manner as in Example 14, a ZnO film was formed in a thickness of 400 Å as the first layer, a Ag film was formed in a thickness of 150 Å as the second layer and a ZnO film was formed in a thickness of 400 Å as the third layer. Then, no protective film was formed thereon. The visible light transmittance of the sample thus obtained was 78.4%. This sample was left to stand in an atmosphere at 50° C. under a relative humidity of 95% for 46 hours, whereupon the transmittance was 75.4%. The change in the transmittance was not so substantial, but by visual observation, pinholes were observed on the entire surface. A finger print was intentionally put on the surface of the film, and the sample was left to stand in an atmosphere at 50° C. under a relative humidity of 95% for 19 hours, whereupon the finger printed portion was hazy with the color completely changed.

COMPARATIVE EXAMPLE 4

By using metal Sn instead of metal Zn as the target, a $SnO_2$ film was formed in a thickness of 400 Å as the first layer, a Ag film was formed in a thickness of 110 Å as the second layer and a $SnO_2$ film was formed in a thickness of 400 Å as the third layer, in the same manner as in Example 14. No protective layer was formed as in Comparative Example 3. The $SnO_2$ film was formed in an atmosphere of 100% pure oxygen gas under a pressure of $3.0 \times 10^{-3}$ Torr at an applied power of 84.7 W/cm$^2$.

The visible light transmittance of the sample thus obtained was 84.7%. This sample was left to stand in an atmosphere at 50° C. under a relative humidity of 95% for 53 hours, whereupon the transmittance was 73.6%, and a scale-patterned haze formed on the entire surface and pinholes were substantial. A finger print was intentionally put on the surface of the film, and the sample was left to stand for 19 hours, whereupon the large pinholes were formed at the finger printed portion. The same sample was left to stand in a weatherometer for 36 hours, whereupon the transmittance was 82.6%, and a haze was slightly observed on the entire surface by visual inspection.

EXAMPLE 16

By using soda lime glass having a thickness of 5 mm, a scratch resistant protective film-provided glass sheet of the present invention was prepared by DC sputtering under the following conditions. As the target, a sintered body of zirconium (Zr) and boron (B) containing boron (B) in a proportion (atomic %) of 67%, was used. As the supplied gas, a gas mixture of oxygen (O$_2$) and argon (Ar) was used at a flow rate of the oxygen (O$_2$) of 30%, so that the vacuum degree in the vacuum chamber was 3.5 m Torr. A DC power source was connected to the target, and −600 V was applied thereto to generate glow discharge, whereby the discharge current density was 20 mA/cm$^2$. Under such a condition, a shutter was open for 37.5 seconds to form a ZrB$_x$O$_y$ (x=0.99, y=3.49) amorphous film on the soda lime glass sheet having a thickness of 5 mm.

The thickness of the film formed on the substrate was 500 Å, and the film was colorless transparent and had a refractive index of 1.8. The content of boron in the film was measured by ESCA, whereby the atomic ratio x of boron to zirconium was found to be 0.99.

With respect to TiO$_2$ and SnO$_2$ coated by conventional dipping or spraying, the soda lime glass surface and the amorphous film of the present invention, the dynamic frictional coefficients by a stainless ball having a diameter of 6 mm under a load of 50 g and at a moving speed of the substrate of 150 mm/min, where measured by Heidon 14 model surface property measuring device manufactured by Shinto Kagakusha K.K. after the surface was wiped with a cloth impregnated with acetone. With respect to the four types of samples, dynamic frictional coefficients of 0.204, 0.282, 0.145 and 0.142 were obtained, respectively. Thus, the amorphous film according to the present invention has excellent lubricating properties and smooth, whereby scratching due to friction scarecely takes place. In fact, by a test wherein an abrasive eraser having a diameter of 5 mm was reciprocated 10 times with a stroke of 30 mm under a load of 500 g, the number of scratch marks was the minimum with the amorphous film of the present invention among the above four types of samples, as visually observed.

Now, more Examples of the article with high durability shown in FIG. 4 will be given.

EXAMPLE 17

A glass substrate was placed in a vacuum chamber of a sputtering apparatus. The chamber was evacuated to a pressure of $1 \times 10^{-6}$ Torr. As a glass substrate, a blue glass substrate having a thickness of 4 mm was used. The same glass substrate was used also in Example 18 et seq. Then, a gas mixture of argon and nitrogen was introduced to bring the pressure to $2 \times 10^{-3}$ Torr. Then, titanium was subjected to reactive sputtering to form titanium nitride (first layer) in a thickness of about 20 Å. Then, the gas was changed to a gas mixture of argon and oxygen, and the pressure was adjusted to $2 \times 10^{-3}$ Torr. Then, a Zr-B target (Zr:B=40:60) was subjected to reactive sputtering to form an oxide film comprising zirconium and boron (second layer) in a thickness of about 200 Å. The visible light transmittance $T_V$, the the solar energy transmittance $T_E$, The visible light reflectance on the coating surface $R_{VF}$, the visible light reflectance on the glass surface $R_{VG}$ and color changes in the transmittance and in the reflectance $\sqrt{(\Delta x)^2 + (\Delta y)^2}$ of the heat radiation shielding glass thus obtained, were 73.3%, 59.0%, 9.2%, 7.7%, 0.0016 and 0.021, respectively.

The transmission color and the reflection color were neutral to such an extent that there was no substantial distinction from the base glass sheet.

The heat radiation shielding glass was immersed in 0.1N hydrochloric acid for 240 hours or 0.1N sodium hydroxide for 240 hours or in boiling water for two hours to examine the durability of the film, whereby no change in the optical properties was observed.

In the abrasion test by means of an abrasive eraser, no substantial scratch mark was observed, and thus the film showed excellent scratch resistance.

EXAMPLE 18

In the same manner as in Example 17, zirconium was subjected to reactive sputtering to form zirconium nitride (first layer) on a glass substrate in a thickness of about 20 Å. Then, the gas was changed to a gas mixture of argon and oxygen, and the pressure was adjusted to $2 \times 10^{-3}$ Torr. Then, a zirconium/boron target (atomic ratio 50/50) was subjected to reactive sputtering to form an oxide film ZrB$_x$O$_y$ comprising zirconium and boron (socond layer x=1.78, y=4.67) in a thickness of about 200 Å.

The optical properties $T_V$, $T_E$, $R_{VF}$, $R_{VG}$ and the color changes in the transmittance and in the reflectance of the heat radiation shielding glass thus obtained, were 76.9%, 61.4%, 8.3%, 7.8%, 0.0017 and 0.0297, respectively.

The heat radiation shielding glass was immersed in 0.1N hydrochloric acid (HCl) for 240 hours or 0.1N sodium hydroxide (NaOH) for 240 hours or in boiling water for two hours to examine the durability of the film of this Example, whereby no change in the optical properties was observed. The durability test was conducted in the same manner as in Example 17, whereby the film showed excellent properties as in Example 17.

We claim:

1. An amorphous complex oxide film consisting essentially of an oxide containing two metals, one metal being Si and the other metal being one member selected from the group consisting of Ti, Hf, Sn, Ta and In.

2. An article with high durability which comprises a substrate and one or more thin film layers formed thereon, wherein the outermost layer is made of the amorphous complex oxide film according to claim 1.

3. The article with high durability according to claim 2, wherein at least two layers comprising a heat radiation reflecting film and the amorphous complex oxide film are formed on the substrate in this order from the substrate side.

4. The article with high durability according to claim 2, wherein at least three layers comprising a transparent dielectric film, a heat radiation reflecting film and the amorphous complex oxide film, are formed on the substrate in this order from the substrate side.

5. The article with high durability according to claim 3, wherein the amorphous complex oxide layer has a refractive index of at most 2.0.

6. The article with high durability according to claim 4, wherein the amorphous complex oxide layer has a refractive index of at most 2.0.

7. The article with high durability according to claim 2, wherein a total of 2n+1 coating layers ($n \geq 1$) including a transparent oxide layer as the 2n+1 layer ($n \geq 0$) and a silver layer as the 2n layer ($n \geq 1$) are formed on the substrate, and the amorphous complex oxide layer is formed on the outermost layer of said 2n+1 coating layers.

8. The article with high durability according to claim 2, wherein one layer of the amorphorus complex oxide film is formed on one side or each side of the substrate.

* * * * *